(12) United States Patent
Negley et al.

(10) Patent No.: US 10,586,787 B2
(45) Date of Patent: Mar. 10, 2020

(54) ILLUMINATION DEVICES USING EXTERNALLY INTERCONNECTED ARRAYS OF LIGHT EMITTING DEVICES, AND METHODS OF FABRICATING SAME

(75) Inventors: Gerald H. Negley, Durham, NC (US); Antony Paul Van De Ven, Hong Kong (CN)

(73) Assignee: CREE, INC., Durham, NC (US)

( * ) Notice: Subject to any disclaimer, the term of this patent is extended or adjusted under 35 U.S.C. 154(b) by 2117 days.

(21) Appl. No.: 12/017,600

(22) Filed: Jan. 22, 2008

(65) Prior Publication Data
US 2008/0211416 A1   Sep. 4, 2008

Related U.S. Application Data

(60) Provisional application No. 60/885,937, filed on Jan. 22, 2007, provisional application No. 60/982,909,
(Continued)

(51) Int. Cl.
*H01L 25/07* (2006.01)
*H01L 33/38* (2010.01)
(Continued)

(52) U.S. Cl.
CPC ........ *H01L 25/0756* (2013.01); *H01L 27/156* (2013.01); *H01L 33/04* (2013.01);
(Continued)

(58) Field of Classification Search
CPC ..... H01L 25/0756; H01L 33/04; H01L 33/32; H01L 33/38; H01L 33/382; H01L 33/0803; H01L 27/156
(Continued)

(56) References Cited

U.S. PATENT DOCUMENTS

| | | |
|---|---|---|
| 4,319,070 A | 3/1982 | Imai et al. |
| 4,329,625 A | 5/1982 | Nishizawa et al. |

(Continued)

FOREIGN PATENT DOCUMENTS

| | | |
|---|---|---|
| CN | 1596560 | 3/2005 |
| CN | 1828921 A | 9/2006 |

(Continued)

OTHER PUBLICATIONS

U.S. Appl. No. 11/854,744, filed Sep. 13, 2007.
(Continued)

*Primary Examiner* — Matthew L Reames
(74) *Attorney, Agent, or Firm* — Withrow & Terranova, P.L.L.C; Vincent K. Gustafson

(57) ABSTRACT

A light emitter, comprising light emitting devices mechanically interconnected by a common substrate and an interconnection submount. The light emitting devices are electrically interconnected by the submount to provide an array of serially connected subsets of light emitting devices, each subset comprising at least three light emitting devices electrically connected in parallel. Also, a light emitter comprising first light emitting devices mechanically interconnected by a first common substrate, and second light emitting devices mechanically interconnected by a second common substrate, the first light emitting devices being mechanically and electrically connected to the second light emitting devices. Also, a light emitter comprising mechanically interconnected light emitting devices and means for mechanically and electrically interconnecting the plurality of light emitting devices to provide an array of serially connected subsets of light emitting devices, each subset comprising at least three light emitting devices electrically connected in parallel. Also, methods of fabricating light emitters.

64 Claims, 17 Drawing Sheets

Related U.S. Application Data filed on Oct. 26, 2007, provisional application No. 60/986,795, filed on Nov. 9, 2007.

(51) Int. Cl.

| | | |
|---|---|---|
| *H01L 25/075* | (2006.01) | |
| *H01L 27/15* | (2006.01) | |
| *H05B 45/00* | (2020.01) | |
| *H01L 33/04* | (2010.01) | |
| *H01L 33/32* | (2010.01) | |
| *H01L 21/265* | (2006.01) | |
| *H01L 33/62* | (2010.01) | |
| *H01L 33/44* | (2010.01) | |

(52) U.S. Cl.
CPC .............. *H01L 33/32* (2013.01); *H01L 33/38* (2013.01); *H01L 33/382* (2013.01); *H05B 45/00* (2020.01); *H01L 21/2654* (2013.01); *H01L 27/153* (2013.01); *H01L 33/385* (2013.01); *H01L 33/44* (2013.01); *H01L 33/62* (2013.01); *H01L 2924/0002* (2013.01)

(58) Field of Classification Search
USPC ...................................... 257/88–94; 315/193
See application file for complete search history.

(56) References Cited

U.S. PATENT DOCUMENTS

| | | | |
|---|---|---|---|
| 4,396,929 A | | 8/1983 | Ohki et al. |
| 4,476,620 A | | 10/1984 | Olchi et al. |
| 4,675,575 A | | 6/1987 | Smith et al. |
| 4,966,862 A | | 10/1990 | Edmond |
| 5,006,908 A | | 4/1991 | Matsuoka et al. |
| 5,087,949 A | | 2/1992 | Haitz |
| 5,136,784 A | * | 8/1992 | Marantz ................... G01C 9/06 33/333 |
| 5,187,547 A | | 2/1993 | Niina et al. |
| 5,210,051 A | | 5/1993 | Carter et al. |
| 5,247,533 A | | 9/1993 | Okazaki et al. |
| 5,266,125 A | | 11/1993 | Rand et al. |
| 5,330,918 A | | 7/1994 | Dubbelday et al. |
| 5,393,993 A | | 2/1995 | Edmond et al. |
| 5,416,342 A | | 5/1995 | Edmond et al. |
| 5,446,440 A | | 8/1995 | Gleason et al. |
| 5,523,589 A | | 6/1996 | Edmond et al. |
| 5,583,351 A | * | 12/1996 | Brown et al. ................... 257/89 |
| 5,639,314 A | | 6/1997 | Kura et al. |
| 5,718,760 A | | 2/1998 | Carter et al. |
| 5,767,581 A | | 6/1998 | Nakamura et al. |
| 5,779,924 A | | 7/1998 | Krames et al. |
| 5,912,477 A | | 6/1999 | Negley |
| 5,917,202 A | | 6/1999 | Haitz et al. |
| 5,952,681 A | | 9/1999 | Chen |
| 5,955,747 A | | 9/1999 | Ogihara et al. |
| 6,033,927 A | | 3/2000 | Shibata et al. |
| 6,046,465 A | | 4/2000 | Wang et al. |
| 6,072,280 A | | 6/2000 | Allen |
| 6,091,085 A | | 7/2000 | Lester |
| 6,097,041 A | | 8/2000 | Lin et al. |
| 6,121,636 A | | 9/2000 | Moria et al. |
| 6,121,637 A | | 9/2000 | Isokawa et al. |
| 6,133,589 A | | 10/2000 | Krames et al. |
| 6,150,771 A | | 11/2000 | Perry |
| 6,153,985 A | | 11/2000 | Grossman |
| 6,169,294 B1 | | 1/2001 | Biing-Jye et al. |
| 6,177,688 B1 | | 1/2001 | Linthicum et al. |
| 6,187,615 B1 | | 2/2001 | Kim et al. |
| 6,194,743 B1 | | 2/2001 | Kondoh et al. |
| 6,194,839 B1 | | 2/2001 | Chang |
| 6,201,353 B1 | | 3/2001 | Chang et al. |
| 6,222,207 B1 | | 4/2001 | Carter-Coman et al. |
| 6,229,120 B1 | | 5/2001 | Krames et al. |
| 6,249,088 B1 | | 6/2001 | Chang |
| 6,288,497 B1 | | 9/2001 | Chang et al. |
| 6,362,578 B1 | | 3/2002 | Swanson et al. |
| 6,388,393 B1 | | 5/2002 | Illingworth |
| 6,410,942 B1 | | 6/2002 | Thibeault et al. |
| 6,459,100 B1 | | 10/2002 | Doverspike et al. |
| 6,461,019 B1 | | 10/2002 | Allen |
| 6,466,188 B1 | | 10/2002 | Cato |
| 6,525,513 B1 | | 2/2003 | Zhao |
| 6,547,249 B2 | | 4/2003 | Collins, III et al. |
| 6,577,512 B2 | | 6/2003 | Tripathi et al. |
| 6,635,503 B2 | | 10/2003 | Andrews et al. |
| 6,657,236 B1 | | 12/2003 | Thibeault et al. |
| 6,747,298 B2 | | 6/2004 | Slater, Jr. et al. |
| 6,784,463 B2 | | 8/2004 | Camras et al. |
| 6,791,119 B2 | | 9/2004 | Slater, Jr. et al. |
| 6,808,287 B2 | | 10/2004 | Lebens et al. |
| 6,821,804 B2 | | 11/2004 | Thibeault et al. |
| 6,830,940 B1 | | 12/2004 | Wasserbauer et al. |
| 6,836,081 B2 | | 12/2004 | Swanson et al. |
| 6,885,035 B2 | | 4/2005 | Bhat et al. |
| 6,888,167 B2 | | 5/2005 | Slater, Jr. et al. |
| 6,958,497 B2 | | 10/2005 | Emerson et al. |
| 7,009,199 B2 | | 3/2006 | Hall |
| 7,186,000 B2 | | 3/2007 | Lebens et al. |
| 7,211,803 B1 | | 5/2007 | Dhurjaty et al. |
| 7,213,940 B1 | | 5/2007 | Van De Ven et al. |
| 7,213,942 B2 | | 5/2007 | Jiang et al. |
| 7,221,044 B2 | | 5/2007 | Fan et al. |
| 7,259,403 B2 | | 8/2007 | Shimizu et al. |
| 7,417,259 B2 | | 8/2008 | Sakai et al. |
| 7,473,934 B2 | | 1/2009 | Nagai et al. |
| 7,524,085 B2 | | 4/2009 | Bedson et al. |
| 7,821,023 B2 | | 10/2010 | Yuan et al. |
| 7,829,906 B2 | | 11/2010 | Donofrio |
| 8,272,757 B1 | * | 9/2012 | Fan et al. ..................... 362/231 |
| 8,716,724 B2 | | 5/2014 | Von Malm et al. |
| 8,835,959 B2 | | 9/2014 | Nakamura et al. |
| 8,963,121 B2 | | 2/2015 | Odnoblyudov et al. |
| 8,969,897 B2 | | 3/2015 | Choi |
| 8,981,395 B2 | | 3/2015 | Choi et al. |
| 9,048,368 B2 | | 6/2015 | Jeong |
| 9,123,864 B2 | | 9/2015 | Tomonari et al. |
| 9,129,977 B2 | | 9/2015 | Marchand et al. |
| 9,130,127 B2 | | 9/2015 | Katsuno et al. |
| 9,130,128 B2 | | 9/2015 | Shinohara |
| 9,130,137 B2 | | 9/2015 | Lin et al. |
| 9,136,432 B2 | | 9/2015 | Yun et al. |
| 9,136,433 B2 | | 9/2015 | Park et al. |
| 9,142,725 B1 | | 9/2015 | Suzuki |
| 9,153,750 B2 | | 10/2015 | Seo et al. |
| 9,159,894 B2 | | 10/2015 | Cho et al. |
| 9,166,107 B2 | | 10/2015 | Park |
| 9,166,108 B2 | | 10/2015 | Unosawa |
| 9,166,110 B2 | | 10/2015 | Aihara |
| 9,166,111 B2 | | 10/2015 | Matsui et al. |
| 9,171,882 B2 | | 10/2015 | Akimoto et al. |
| 9,172,002 B2 | | 10/2015 | Wang et al. |
| 9,172,021 B2 | | 10/2015 | Sugizaki et al. |
| 9,178,121 B2 | | 11/2015 | Edmond et al. |
| 9,196,653 B2 | | 11/2015 | Leatherdale et al. |
| 9,209,223 B2 | | 12/2015 | Lee et al. |
| 9,219,196 B2 | | 12/2015 | Seo et al. |
| 9,219,200 B2 | | 12/2015 | Erchak et al. |
| 9,231,037 B2 | | 1/2016 | Shimayama |
| 9,236,526 B2 | | 1/2016 | Choi et al. |
| 9,240,433 B2 | | 1/2016 | Kim et al. |
| 9,252,345 B2 | | 2/2016 | Cho et al. |
| 9,263,643 B2 | | 2/2016 | Huang et al. |
| 9,263,652 B2 | | 2/2016 | Yoon et al. |
| 9,269,858 B2 | | 2/2016 | Schubert et al. |
| 9,277,618 B2 | | 3/2016 | Odnoblyudov et al. |
| 9,281,448 B2 | | 3/2016 | Choi et al. |
| 9,281,449 B2 | | 3/2016 | Kim et al. |
| 9,287,457 B2 | | 3/2016 | Jeong et al. |
| 9,293,664 B2 | | 3/2016 | Seo et al. |
| 9,293,674 B2 | | 3/2016 | Kususe et al. |
| 9,293,675 B2 | | 3/2016 | Yang et al. |
| 9,299,889 B2 | | 3/2016 | Katsuno et al. |
| 9,299,893 B2 | | 3/2016 | Chen et al. |

(56) References Cited

U.S. PATENT DOCUMENTS

| | | | |
|---|---|---|---|
| 9,300,111 B2 | 3/2016 | Lee et al. | |
| 9,318,529 B2 | 4/2016 | Jang et al. | |
| 9,324,765 B2 | 4/2016 | An | |
| 9,337,175 B2 | 5/2016 | Seo et al. | |
| 9,373,756 B2 | 6/2016 | Lee et al. | |
| 2001/0050531 A1 | 12/2001 | Ikeda | |
| 2002/0015013 A1 | 2/2002 | Ragle | |
| 2002/0139987 A1 | 10/2002 | Collins, III et al. | |
| 2003/0015959 A1 | 1/2003 | Tomoda et al. | |
| 2003/0042908 A1 | 3/2003 | St-Germain | |
| 2003/0042914 A1 | 3/2003 | St-Germain | |
| 2003/0045015 A1 | 3/2003 | Slater, Jr. et al. | |
| 2003/0067302 A1 | 4/2003 | St-Gemiain | |
| 2003/0073284 A1 | 4/2003 | Ping | |
| 2003/0089918 A1 | 5/2003 | Hiller et al. | |
| 2003/0178627 A1 | 9/2003 | Marchl et al. | |
| 2003/0183751 A1* | 10/2003 | Hakamata | G03G 15/054 250/216 |
| 2003/0189829 A1 | 10/2003 | Shimizu et al. | |
| 2003/0209997 A1 | 11/2003 | St-Germain et al. | |
| 2004/0263346 A1* | 12/2004 | Neal | B60Q 1/10 340/815.45 |
| 2005/0017256 A1 | 1/2005 | Slater, Jr. et al. | |
| 2005/0026311 A1 | 2/2005 | Wasserbauer et al. | |
| 2005/0057929 A1 | 3/2005 | Yano et al. | |
| 2005/0077838 A1 | 4/2005 | Blumel | |
| 2005/0174064 A1 | 8/2005 | Agostinelli et al. | |
| 2005/0225973 A1 | 10/2005 | Eliashevich et al. | |
| 2005/0253151 A1 | 11/2005 | Sakai et al. | |
| 2005/0253492 A1 | 11/2005 | Besshi et al. | |
| 2006/0044864 A1 | 3/2006 | Lin et al. | |
| 2006/0056123 A1 | 3/2006 | Aoyagi et al. | |
| 2006/0071806 A1* | 4/2006 | Hollnberger | G09F 9/33 340/815.45 |
| 2006/0113548 A1 | 6/2006 | Chen et al. | |
| 2006/0163589 A1 | 7/2006 | Fan et al. | |
| 2006/0169994 A1 | 8/2006 | Tu et al. | |
| 2006/0171135 A1 | 8/2006 | Ishizaka et al. | |
| 2006/0180818 A1 | 8/2006 | Nagai et al. | |
| 2006/0256826 A1 | 11/2006 | Lin et al. | |
| 2007/0065960 A1 | 3/2007 | Fukshima et al. | |
| 2007/0138500 A1 | 6/2007 | Sakai et al. | |
| 2007/0202623 A1 | 8/2007 | Gao et al. | |
| 2007/0223219 A1 | 9/2007 | Medendorp, Jr. et al. | |
| 2007/0235863 A1 | 10/2007 | Lee et al. | |
| 2007/0241360 A1 | 10/2007 | Slater, Jr. et al. | |
| 2007/0284598 A1 | 12/2007 | Shakuda et al. | |
| 2008/0017871 A1 | 1/2008 | Lee et al. | |
| 2008/0083929 A1* | 4/2008 | Fan | H01L 27/15 257/79 |
| 2008/0088248 A1 | 4/2008 | Myers | |
| 2008/0099772 A1* | 5/2008 | Shuy | H01L 27/156 257/88 |
| 2008/0106895 A1 | 5/2008 | Van De Ven et al. | |
| 2008/0179602 A1 | 7/2008 | Negley et al. | |
| 2008/0179611 A1 | 7/2008 | Chitnis et al. | |
| 2008/0194054 A1* | 8/2008 | Lin | H01L 25/0753 438/64 |
| 2009/0179843 A1 | 7/2009 | Ackermann et al. | |
| 2010/0015574 A1 | 1/2010 | van der Zel et al. | |
| 2011/0241031 A1 | 10/2011 | Von Malm et al. | |
| 2011/0297997 A1 | 12/2011 | Izuka et al. | |
| 2012/0119237 A1 | 5/2012 | Leatherdale et al. | |

FOREIGN PATENT DOCUMENTS

| | | |
|---|---|---|
| EP | 0 961 328 | 12/1999 |
| EP | 1 553 641 A1 | 7/2005 |
| EP | 1 566 848 | 8/2005 |
| EP | 1647967 A1 | 4/2006 |
| EP | 2320483 | 5/2011 |
| EP | 2393132 | 12/2011 |
| GB | 1 418 473 | 12/1975 |
| GB | 2 346 480 | 8/2000 |
| JP | 56-131977 | 10/1981 |
| JP | S63318172 A | 12/1988 |
| JP | 01-225377 | 9/1989 |
| JP | 09-082587 | 3/1997 |
| JP | 10-256604 | 9/1998 |
| JP | 2000101136 A | 4/2000 |
| JP | 2000114142 A | 4/2000 |
| JP | 2000-195827 | 7/2000 |
| JP | 2001-156331 | 6/2001 |
| JP | 2001-307506 | 11/2001 |
| JP | 2002043627 A | 2/2002 |
| JP | 2002-270905 | 9/2002 |
| JP | 2003-303504 | 10/2003 |
| JP | 2004006582 A | 1/2004 |
| JP | 2004014899 A | 1/2004 |
| JP | 2005-117028 | 4/2005 |
| JP | 2005235779 A | 9/2005 |
| JP | 2006-222412 | 8/2006 |
| JP | 2006-303525 | 11/2006 |
| JP | 5657563 | 1/2015 |
| JP | 5788046 | 9/2015 |
| WO | 2005099310 A2 | 10/2005 |
| WO | WO 2006/061728 | 6/2006 |
| WO | 2007/001116 A1 | 1/2007 |
| WO | 2008062783 A1 | 5/2008 |

OTHER PUBLICATIONS

U.S. Appl. No. 11/948,021, filed Nov. 30, 2007.
U.S. Appl. No. 12/017,558, filed Jan. 22, 2008.
U.S. Appl. No. 12/017,676, filed Jan. 22, 2008.
Miyachi et al., "Development of Light Sources by Large-Scale Integrated Light-Emitting Diodes", First International Conference on White LEDs and Solid State Lighting.
Kanamori, "High-Power White LEDs Based on a Multiple Small Chip Structure," First International Conference on White LEDs and Solid State Lighting.
Ng et al., "Light Emitting Diodes with Variable Spectral Output," First International Conference on White LEDs and Solid State Lighting.
Jin et al., "InGaN/GaN quantum well interconnected microdisk light emitting diodes".
Spitzer et al., "Multijunction AC or DC Integrated GaP Light Emitting Diode Array".
2010-0155746 (U.S. Appl. No. 12/418,816), Jun. 24, 2010 (filed Apr. 6, 2009), Ibbetson et al.
2010-0252840 (U.S. Appl. No. 12/814,241), Oct. 7, 2010 (filed Jun. 11, 2010), Ibbetson et al.
2011-0084294 (U.S. Appl. No. 12/905,995), Apr. 14, 2011 (filed Oct. 15, 2010), Yao.
"OSRAM Enhances Brightness of Blue InGaN LEDs," Compound Semiconductor, vol. 7, No. 1, Feb. 2001.
Biederman, "The Optical Absorption Bands and Their Anisotropy in the Various Modifications of SiC," Solid State Communications, Vo. 3, 1965, pp. 343-346.
Craford, "Outlook for AlInGaP Technology," Presentation, Strategies in Light 2000.
Craford, "Overview of Device Issues in High-Brightness Light-Emitting Diodes," Chapter, *High Brightness Light Emitting Diodes: Semiconductors and Semimetals,* vol. 48, Stringfellow et al. ed., Academic Press, 1997, pp. 47-63.
Krames et al., "High-Power Truncated-Inverted-Pyramid (AlxGa1-x)0.5In0.5P/GaP Light-Emitting Diodes Exhibiting >50% External Quantum Efficiency," Applied Physics Letters, vol. 75, No. 16, Oct. 18, 1999, pp. 2365-2367.
Lambrecht et al., "Band Structure Interpretation of the Optical Transitions Between Low-Lying Conduction Bands in n-Type Doped SiC Polytypes," Materials Science Forum, vols. 264-268, 1998, pp. 271-274.
Yoo et al., "Bulk Crystal Growth of 6H-SiC on Polytype-Controlled Substrates Through Vapor Phase and Characterization," Journal of Crystal Growth, Vo. 115, vol. 1991, pp. 733-739.
Chinese Office Action (and translation provided by foreign counsel) from a corresponding Chinese patent application dated Apr. 30, 2014, 20 pages.

(56) References Cited

OTHER PUBLICATIONS

Chinese Office Action (and translation provided by foreign counsel) from a corresponding Chinese patent application dated Apr. 29, 2015, 29 pages.
Chinese Office Action (and translation provided by foreign counsel) from a corresponding Chinese patent application dated Nov. 4, 2014, 30 pages.
European Office Action from a corresponding European patent application dated Aug. 30, 2017, 11 pages.
Author Unknown, "MBI5026: 16-bit Constant Current LED Sink Driver," Datasheet, Version 1.0, Mar. 2004, Hsinchu, Taiwan, www.DatasheetCatalog.com, Macroblock, Inc., pp. 1-15.
Non-Final Office Action for U.S. Appl. No. 15/464,801, dated Nov. 9, 2017, 14 pages.
Final Office Action for U.S. Appl. No. 15/464,801, dated May 29, 2018, 10 pages.
Notice of Allowance for U.S. Appl. No. 15/464,801, dated Sep. 6, 2018, 7 pages.
Examination Report for European Patent Application No. 08728033.5, dated Dec. 29, 2011, 11 pages.
Examination Report for European Patent Application No. 08728033.5, dated Sep. 16, 2013, 8 pages.
Examination Report for European Patent Application No. 08728033.5, dated May 7, 2015, 6 pages.
Examination Report for European Patent Application No. 08728033.5, dated Sep. 1, 2016, 6 pages.
Notice of Reasons for Refusal for Japanese Patent Application No. 2009-546569, dated Mar. 9, 2012, 6 pages.
Search Report for Japanese Patent Application No. 2009-546569, dated Mar. 14, 2012, 29 pages.
Decision of Refusal for Japanese Patent Application No. 2009-546569, dated Oct. 16, 2012, 4 pages.
Notice of Reasons for Refusal for Japanese Patent Application No. 2009-546569, dated Jul. 26, 2013, 4 pages.
Trial and Appeal Decision for Japanese Patent Application No. 2009-546569, mailed Apr. 1, 2014, 16 pages.
Notification of Reason for Refusal for Korean Patent Application No. 10-2009-7017522, dated Feb. 12, 2014, 19 pages.
Notice of Final Rejection for Korean Patent Application No. 10-2009-7017522, dated Sep. 12, 2014, 7 pages.
Grant of Patent for Korean Patent Application No. 10-2009-7017522, dated Feb. 16, 2015, 2 pages.
International Search Report and Written Opinion for International Patent Application No. PCT/US2008/051625, dated Oct. 22, 2008, 17 pages.
International Preliminary Report on Patentability for International Patent Application No. PCT/US2008/051625, dated Jul. 22, 2009, 11 pages.
Non-Final Office Action for U.S. Appl. No. 12/017,558, dated Sep. 11, 2009, 35 pages.
Final Office Action for U.S. Appl. No. 12/017,558, dated Mar. 15, 2010, 37 pages.
Advisory Action for U.S. Appl. No. 12/017,558, dated Jun. 4, 2010, 3 pages.
Examiner's Answer for U.S. Appl. No. 12/017,558, dated Mar. 18, 2011, 48 pages.
Decision on Appeal for U.S. Appl. No. 12/017,558, mailed Jan. 31, 2014, 17 pages.
Office Communication for U.S. Appl. No. 12/017,558, dated Apr. 24, 2014, 3 pages.
Non-Final Office Action for U.S. Appl. No. 12/017,558, dated Dec. 29, 2014, 24 pages.
Final Office Action for U.S. Appl. No. 12/017,558, dated May 7, 2015, 24 pages.
Advisory Action for U.S. Appl. No. 12/017,558, dated Sep. 4, 2015, 3 pages.
Notice of Allowance for U.S. Appl. No. 12/017,558, dated Feb. 17, 2016, 8 pages.
Examination Report for European Patent Application No. 08728021.0, dated Dec. 29, 2011, 8 pages.
Examination Report for European Patent Application No. 08728021.0, dated Aug. 9, 2016, 5 pages.
Search Report for Japanese Patent Application No. 2009-546567, dated Mar. 7, 2012, 26 pages.
Notice of Reasons for Refusal for Japanese Patent Application No. 2009-546567, dated Mar. 9, 2012, 4 pages.
Decision of Refusal for Japanese Patent Application No. 2009-546567, dated Dec. 14, 2012, 4 pages.
Reconsideration Report by Examiner before Appeal for Japanese Patent Application No. 2009-546567, dated Jun. 10, 2013, 2 pages.
Inquiry for Japanese Patent Application No. 2009-546567, dated Jul. 9, 2013, 6 pages.
Notice of Reasons for Refusal for Japanese Patent Application No. 2009-546567, dated Mar. 7, 2014, 7 pages.
Trial and Appeal Decision for Japanese Patent Application No. 2009-546567, mailed Dec. 9, 2014, 19 pages.
Notification of Reason for Refusal for Korean Patent Application No. 10-2009-7017548, dated Feb. 12, 2014, 13 pages.
Notice of Final Rejection for Korean Patent Application No. 10-2009-7017548, dated Jul. 10, 2014, 5 pages.
International Search Report and Written Opinion for International Patent Application No. PCT/US2008/051611, dated Aug. 6, 2008, 10 pages.
International Preliminary Report on Patentability for International Patent Application No. PCT/US2008/051611, dated Jul. 22, 2009, 7 pages.

* cited by examiner

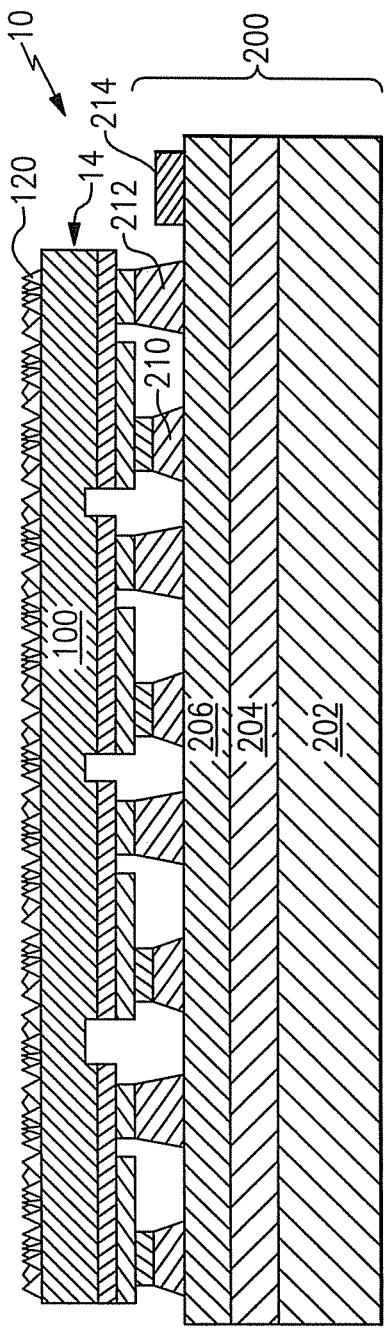
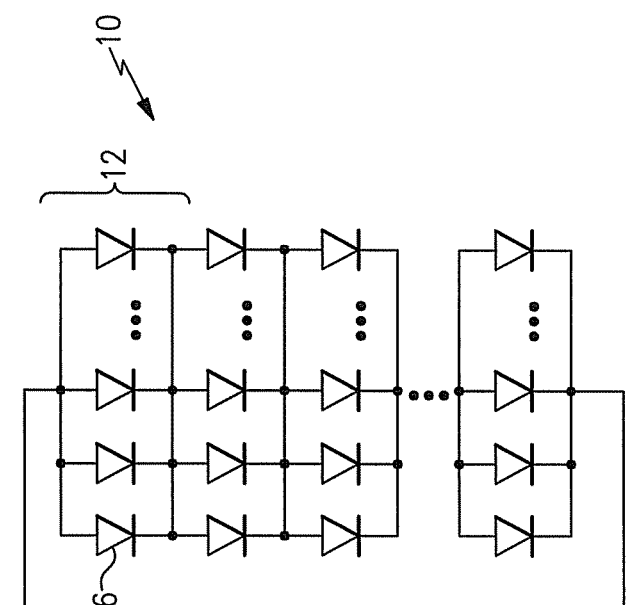
FIG.4
FIG.5

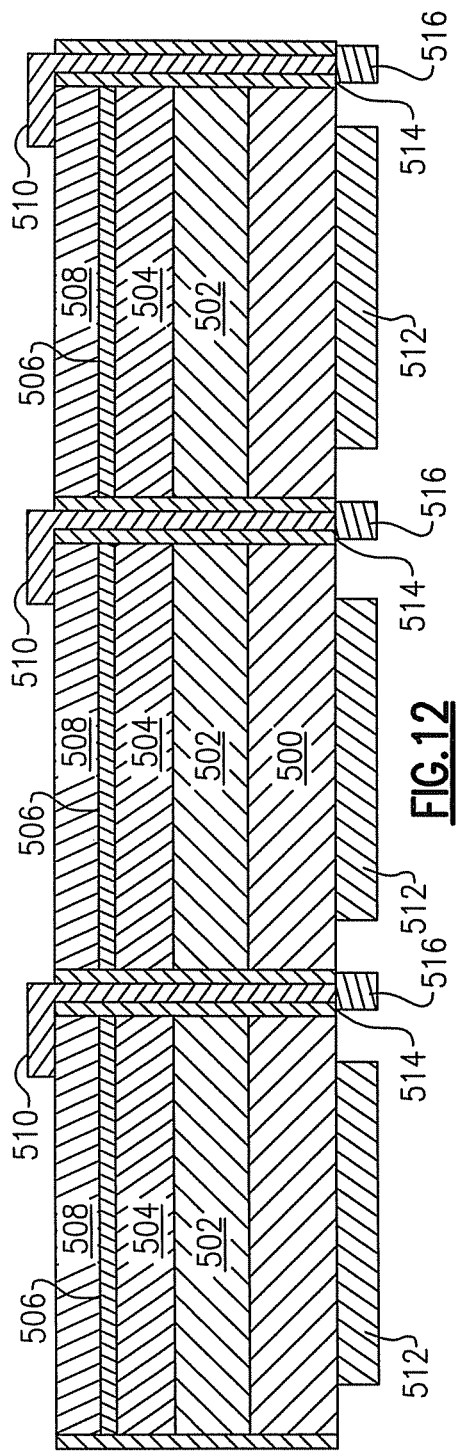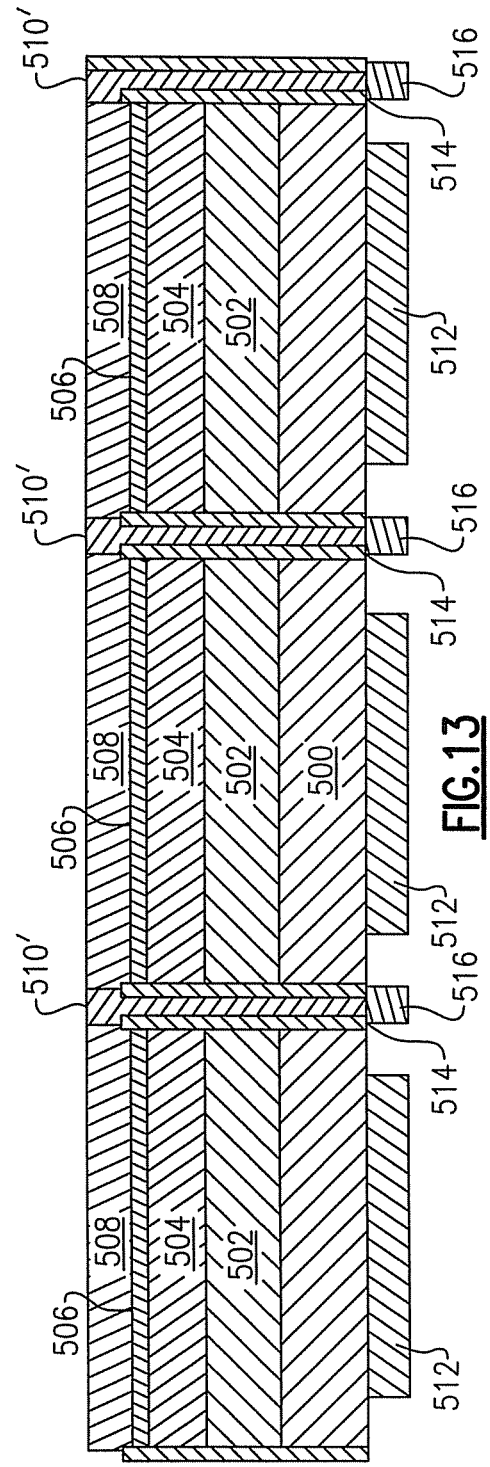

ILLUMINATION DEVICES USING EXTERNALLY INTERCONNECTED ARRAYS OF LIGHT EMITTING DEVICES, AND METHODS OF FABRICATING SAME

CROSS-REFERENCE TO RELATED APPLICATIONS

This application claims the benefit of U.S. Provisional Patent Application No. 60/982,909, filed Oct. 26, 2007, the entirety of which is incorporated herein by reference.

This application claims the benefit of U.S. Provisional Patent Application No. 60/986,795, filed Nov. 9, 2007, the entirety of which is incorporated herein by reference.

This application claims the benefit of U.S. Provisional Patent Application No. 60/885,937, filed Jan. 22, 2007, the entirety of which is incorporated herein by reference.

FIELD OF THE INVENTION(S)

The present inventive subject matter relates to light emitters, systems incorporating such light emitters, and methods of making such light emitters and systems. In some aspects, the present inventive subject matter is directed to externally interconnected arrays of light emitting devices.

BACKGROUND OF THE INVENTION(S)

To date, the highest light extraction for a light emitting diode device and a light emitting diode package (LED) (more chip-specific than package-specific) has generally been with small light emitting diode devices (~300 micrometers×300 micrometers) as compared with "power chips" (light emitting diode devices of ~0.9–1 mm×0.9–1 mm).

FIG. 1 is a schematic illustration of a conventional InGaN light emitting diode with two "top side" contacts. The light emitting diode typically includes a substrate, such as sapphire or SiC. The substrate may be insulating or semi-insulating. A buffer layer or layers is provided on the substrate. The buffer layer(s) may, for example, be AlN, GaN and/or AlGaN. An n-type GaN contact layer is provided on the buffer layer(s). Quantum well layers, typically of very thin InGaN and InAlGaN, are provided on the n-type contact layer. A p-type GaN contact layer is provided on the quantum well layers. An opening is provided in the p-type contact layer to provide an exposed n-contact region, and quantum well layers and an n-type contact are provided. A p-type contact region is provided on the p-type GaN contact layer. The periphery of the device may be defined by an etched trench and a passivation/protective layer provided on exposed surfaces of the active layers of the device. The passivation/protective layer may, for example, be an insulating layer, such as $SiO_2$ or SiN. The light emitting diodes are typically formed on a wafer and then singulated into individual die for subsequent packaging or surface mounting. Nitride based light emitting diodes, and in particular, multi-quantum well nitride based light emitting diode are known to those of skill in the art. See for example, U.S. Pat. No. 6,958,497.

Efforts have been ongoing to develop ways by which light emitter's can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which have improved energy efficiency.

Various efforts have been directed at improving light emitting diodes on a common substrate. For example:

U.S. Pat. No. 6,635,503 describes cluster packaging of light emitting diodes;

United States Patent Application Publication No. 2003/0089918 describes broad spectrum light emitting devices and methods and systems for fabricating broad spectrum light emitting devices;

U.S. Pat. No. 6,547,249 describes monolithic series/parallel light emitting diode arrays formed on highly resistive substrates;

U.S. Pat. No. 7,009,199 describes electronic devices having a header and anti-parallel connected light emitting diodes for producing light from AC current;

U.S. Pat. No. 6,885,035 describes multi-chip semiconductor light emitting diode assemblies;

U.S. Pat. Nos. 7,213,942 and 7,221,044 each describe single chip integrated light emitting diodes adapted for direct use with a high AC or DC voltage;

United States Patent Application Publication No. 2005/0253151 describes a light emitting device operating on a high drive voltage and a small drive current;

Japanese Patent Publication No. 2001-156331 describes a plurality of nitride semiconductor layers formed on the same substrate, where the layers are electrically separated from each other and each nitride semiconductor layer is electrically connected with a conductive wire;

Japanese Patent Publication No. 2001-307506 describes two or more light emitting diodes being formed on the same semiconductor substrate; and United States Patent Application Publication No. 2007/0202623 describes a wafer level package for very small footprint and low profile white light emitting diode devices.

SUMMARY OF THE INVENTION(S)

The question of whether or not "power chips" (larger area light emitting diode devices) make sense in a given light emitting diode lighting (illumination) application should be viewed at the "systems level". That is, it is necessary to consider "chip" (light emitting diode device) efficiency, package efficiency, driver (AC to DC conversion) efficiency and optic efficiency. The best performance of driver technology for light emitters which include light emitting diode devices (and/or one or more other solid state light emitting devices) is with "higher voltage, lower current" compared to "lower voltage, higher current". Typical small light emitting diode devices run at ~20-30 mA of current and ~3 volts, whereas typical power chips run at ~350, mA and 3 volts.

The improved driver technology at lower drive currents can be viewed as follows:

a) There is a fixed cost (power drops) that occurs in a driver assembly. These driver assemblies are made of "pn junctions" so that there is a power loss each time that a "junction" is added in the driver technology. Hence, the overhead (this fixed cost of power) can be amortized over each light emitting diode device, such that the cost of going to higher voltage strings and many light emitting diode devices is better than lower voltage strings and few parts.

b) The associated loss of power with current (at fixed resistance) is $I^2R$ Hence, the lower current approach will always reach higher efficiencies.

Owing to this, driver efficiencies of 80%-85% are obtainable for "power chip technology" while driver efficiencies of 95% are obtainable for standard light emitting diode device technology.

The present inventive subject matter provides light emitters in which activation of the light emitter (i.e., supplying electricity to it) activates more than one light emitting device contained in the light emitter, i.e., the light emitters are not arrays of individual addressable light emitting devices (such as in the case of displays and the like).

In a first aspect of the present inventive subject matter, there is provided a high voltage light emitter, comprising:

a plurality of light emitting devices mechanically interconnected by a common substrate on which the light emitting devices are formed;

an interconnection submount to which the plurality of light emitting devices are mechanically and electrically connected;

wherein the light emitting devices are electrically interconnected by the interconnection submount to provide an array of at least two serially connected subsets of light emitting devices, each subset comprising at least three light emitting devices electrically connected in parallel.

The large area structure of this aspect of the inventive subject matter (and others, as described below) includes a plurality of light emitting devices electrically connected in an array Arrays are sometimes referred to herein as including "rows" and "columns." The arrays according to the present inventive subject matter each have a dimension of at least three columns of light emitting devices. Each of the "rows" in the array is one of the subsets of parallel-connected light emitting devices. Each of the "columns" in the array includes one of the light emitting devices from each of the subsets, i.e., the array includes a number of columns which is equal to the number of light emitting devices in each of the "rows" (i.e., subsets). The present inventive subject matter, however, is not limited to light emitters in which each subset includes the same number of light emitting devices, i.e., the present inventive subject matter encompasses light emitters in which some or all of the subsets include different numbers of light emitting devices. Thus, the arrays include at least three columns and at least two rows of light emitting devices.

Various arrays are described in commonly assigned and concurrently filed U.S. patent application Ser. No. 12/017, 558 (now U.S. Patent Application Publication No. 2008/0179602), filed Jan. 22, 2008, entitled FAULT TOLERANT LIGHT EMITTERS, SYSTEMS INCORPORATING FAULT TOLERANT LIGHT EMITTERS AND METHODS OF FABRICATING FAULT TOLERANT LIGHT EMITTERS, as well as U.S. Patent Application No. 60/885, 937, filed on Jan. 22, 2007, entitled "HIGH VOLTAGE SOLID STATE LIGHT EMITTER", U.S. Patent Application No. 60/982,892, filed on Oct. 26, 2007, entitled "FAULT TOLERANT LIGHT EMITTERS, SYSTEMS INCORPORATING FAULT TOLERANT LIGHT EMITTERS AND METHODS OF FABRICATING FAULT TOLERANT LIGHT EMITTERS", and U.S. Patent Application No. 60/986,662, filed on Nov. 9, 2007, the entireties of which are hereby incorporated by reference.

The array electrical interconnection provides for the anodes (and/or the cathodes) of the light emitting devices in a row to be electrically connected together and the cathodes to be electrically connected to anodes of the light emitting devices in an adjacent row. The number of columns refers to the number of light emitting devices whose anodes are electrically connected together (i.e., the number of devices in a subset). By electrically connecting the light emitting devices in such an array, the failure of one or more light emitting device in any row of the array may be compensated for by the other die in the row. Similarly, by electrically connecting the light emitting devices in an array, failure of one or more light emitting devices in a column may also be compensated for by the other light emitting devices in the array. Preferably, a large number or rows are included to make the large area multi-die light emitter a higher voltage light emitter to provide a large reduction in resistive losses.

The expression "high voltage", as used herein, means that the voltage drop across a light emitter is at least three times that of one of the light emitting devices included in the light emitter, i.e.:

$V \geq V_f$ of at least three series light emitting devices.

In some embodiments according to this aspect of the present inventive subject matter, fewer than all of the plurality of light emitting devices are electrically interconnected in the array of light emitting devices.

In some embodiments according to this aspect of the present inventive subject matter, the interconnection submount comprises:

a submount substrate;

an insulator layer on the submount; and a pattern of electrically conductive elements on the insulator layer and configured to interconnect respective contacts of the light emitting devices into the array of light emitting devices.

In some embodiments according to this aspect of the present inventive subject matter, the interconnection submount further comprises a mirrored layer disposed between the submount substrate and the insulator layer.

In some embodiments according to this aspect of the present inventive subject matter, all of the electrical interconnections of light emitting devices are provided by the pattern of electrically conductive elements.

In some embodiments according to this aspect of the present inventive subject matter, a portion of the interconnections of light emitting devices is provided by the pattern of electrically conductive elements and a portion of the interconnections are provided by conductive elements on the common substrate of the plurality of light emitting devices.

In some embodiments according to this aspect of the present inventive subject matter, the light emitting devices comprise light emitting diode devices.

In some embodiments according to this aspect of the present inventive subject matter, the light emitting diode devices are isolated from one another by at least one insulating region.

In some embodiments according to this aspect of the present inventive subject matter, the light emitting diode devices are isolated from one another by at least one trench.

A statement that two or more elements are "isolated" from each other means that the respective elements are not electrically connected with each other (even though, for example, they might both be in contact with another element).

Statements herein that two or more elements are each isolated regions of a single monolithic layer (e.g., "the first n-type region, the second n-type region, the third n-type region, the fourth n-type region, the fifth n-type region and the sixth n-type region are each isolated regions of a single monolithic n-type layer"), and similar statements, means that (at least) each of the elements (e.g., each of the light emitting diode devices or each of the first through sixth n-type regions, etc.) includes structural features which persons of ordinary skill in the art recognize inherently result from being formed as a single integral monolithic layer and later being isolated from each other, e.g., by forming one or more trenches, implanting ions, etc., such that electricity cannot be conducted directly between the respective n-type regions. Analogous statements apply with respect to analogous statements herein, e.g., that p-type regions are isolated regions of a single monolithic p-type layer, etc.

In some embodiments according to this aspect of the present inventive subject matter, the light emitting diode devices comprise lateral devices and/or vertical devices and have both cathode and anode connections on a same side of the light emitting diode devices.

In some embodiments according to this aspect of the present inventive subject matter, the plurality of light emitting devices have different sizes and/or shapes.

In a second aspect of the present inventive subject matter, there is provided a high voltage light emitter, comprising:

a first plurality of light emitting devices mechanically interconnected by a first common substrate on which the light emitting devices are formed;

an interconnection submount to which the plurality of light emitting devices are mechanically and electrically connected, the interconnection submount having electrical circuitry thereon; and wherein the light emitting devices are electrically interconnected by the interconnection submount to provide a series of parallel-connected subsets of light emitting devices.

In some embodiments according to this aspect of the present inventive subject matter, the array comprises at least two serially connected subsets of light emitting devices, each subset comprising at least three light emitting devices electrically connected in parallel.

In some embodiments according to this aspect of the present inventive subject matter, the electrical circuitry comprises power supply circuitry configured to supply power to the light emitting devices.

In some embodiments according to this aspect of the present inventive subject matter, the electrical circuitry comprises light emitting devices other than the plurality of light emitting devices mechanically interconnected by the common substrate.

In some embodiments according to this aspect of the present inventive subject matter, the electrical circuitry comprises:

light emitting devices other than the first plurality of light emitting devices mechanically interconnected by the first common substrate; and power supply circuitry configured to supply power to the light emitting devices.

In some embodiments according to this aspect of the present inventive subject matter, the plurality of light emitting devices have different sizes and/or shapes.

In some embodiments according to this aspect of the present inventive subject matter, the electrical circuitry comprises a plurality of fuses configured to selectively isolate failing ones of the plurality of light emitting devices.

In a third aspect of the present inventive subject matter, there is provided a high voltage light emitter comprising:

a plurality of first light emitting devices mechanically interconnected by a first common substrate on which the first light emitting devices are formed;

a plurality of second light emitting devices mechanically interconnected by a second common substrate on which the second light emitting devices are formed; and wherein the first plurality of light emitting devices are mechanically and electrically connected to the second plurality of light emitting devices.

In some embodiments according to this aspect of the present inventive subject matter, the first and second light emitting devices are electrically interconnected to provide an array comprising a series of parallel-connected light emitting devices.

In some embodiments according to this aspect of the present inventive subject matter, the array comprises at least two serially connected subsets of light emitting devices, each subset comprising at least three light emitting devices electrically connected in parallel.

In some embodiments according to this aspect of the present inventive subject matter, the light emitting devices comprise light emitting diode devices.

In some embodiments according to this aspect of the present inventive subject matter, the light emitting diode devices are vertical light emitting diode devices.

In some embodiments according to this aspect of the present inventive subject matter, the light emitting diode devices are horizontal light emitting diode devices.

In some embodiments according to this aspect of the present inventive subject matter, the light emitter further comprises:

a plurality of third light emitting devices mechanically interconnected by a third common substrate on which the third light emitting devices are formed; and wherein the third plurality of light emitting devices are mechanically and electrically connected to the second plurality of light emitting devices.

In some embodiments according to this aspect of the present inventive subject matter, the first and/or second plurality of light emitting devices have different sizes and/or shapes.

In a fourth aspect of the present inventive subject matter, there is provided a high voltage light emitter, comprising:

a plurality of light emitting devices mechanically interconnected by a common substrate; and means for mechanically and electrically interconnecting the plurality of light emitting devices to provide an array of at least two serially connected subsets of light emitting devices, each subset comprising at least three light emitting devices electrically connected in parallel.

In some embodiments according to this aspect of the present inventive subject matter, the light emitter further comprises means for selectively interconnecting the plurality of light emitting devices such that fewer than all of the plurality of light emitting devices are interconnected in the array.

In a fifth aspect of the present inventive subject matter, there is provided a method of fabricating a high voltage light emitter, comprising:

providing a plurality of light emitting devices mechanically interconnected by a common substrate on which the light emitting devices are formed; and mounting the common substrate on an interconnection submount to mechanically and electrically connect the plurality of light emitting devices, wherein the light emitting devices are electrically interconnected by the interconnection submount to provide an array of at least two serially connected subsets of light emitting devices, each subset comprising at least three light emitting devices electrically connected in parallel.

In a sixth aspect of the present inventive subject matter, there is provided a method of fabricating a high voltage light emitter, comprising:

providing a first plurality of light emitting devices mechanically interconnected by a first common substrate on which the light emitting devices are formed;

providing an interconnection submount, the interconnection submount having electrical circuitry thereon; and mounting the first common substrate on the interconnection submount to mechanically and electrically connect the light emitting devices to provide an array comprising a series of parallel-connected light emitting devices.

In some embodiments according to this aspect of the present inventive subject matter, the method further comprises testing at least one of the light emitting devices.

In some embodiments according to this aspect of the present inventive subject matter, the method further comprises testing at least one of the light emitting devices and electrically disconnecting one of the light emitting devices from the light emitting device.

In some embodiments according to this aspect of the present inventive subject matter, the step of electrically disconnecting one of the light emitting devices is carried out by etching an anode contact or a cathode contact of one of the light emitting devices.

In some embodiments according to this aspect of the present inventive subject matter, the step of electrically disconnecting one of the light emitting devices is carried out by applying insulating material on an anode contact or a cathode contact of one of the light emitting devices.

In a seventh aspect of the present inventive subject matter, there is provided a method of fabricating a high voltage light emitter comprising:
   providing a plurality of first light emitting devices mechanically interconnected by a first common substrate on which the first light emitting devices are formed;
   providing a plurality of second light emitting devices mechanically interconnected by a second common substrate on which the second light emitting devices are formed; and
   mounting the first plurality of light emitting devices on the second plurality of light emitting devices to electrically and mechanically interconnect the first plurality of light emitting devices and the second plurality of light emitting devices.

In some embodiments according to this aspect of the present inventive subject matter, the method further comprises testing at least one of the light emitting devices.

In some embodiments according to this aspect of the present inventive subject matter, the method further comprises testing at least one of the light emitting devices and electrically disconnecting one of the light emitting devices from the light emitting device.

In some embodiments according to this aspect of the present inventive subject matter, the step of electrically disconnecting one of the light emitting devices is carried out by etching an anode contact or a cathode contact of one of the light emitting devices.

In some embodiments according to this aspect of the present inventive subject matter, the step of electrically disconnecting one of the light emitting devices is carried out by applying insulating material on an anode contact or a cathode contact of one of the light emitting devices.

In an eighth aspect of the present inventive subject matter, there is provided a method of fabricating a high voltage light emitter comprising:
   testing respective ones of a plurality of light emitting devices on a common substrate to determine if a respective one has a short circuit failure;
   isolating ones of the plurality of light emitting devices that are determined to have a short circuit failure; and
   mounting the plurality of light emitting devices on an interconnection submount so as to electrically connect the non-isolated ones of the plurality of light emitting devices.

In some embodiments according to this aspect of the present inventive subject matter, the electrical connection comprises connecting the non-isolated ones of the plurality of light emitting devices into an array of serially connected parallel subsets of the plurality of light emitting devices.

In a ninth aspect of the present inventive subject matter, there is provided a light emitter, comprising:
   a monolithic n-type layer;
   a monolithic p-type layer; and
   at least a first interconnection element,
   the n-type layer comprising a first n-type region, a second n-type region, a third n-type region, a fourth n-type region, a fifth n-type region, and a sixth n-type region,
   the first n-type region, the second n-type region, the third n-type region, the fourth n-type region, the fifth n-type region, and the sixth n-type region each being isolated from each other,
   the p-type layer comprising a first p-type region, a second p-type region, a third p-type region, a fourth p-type region, a fifth p-type region, and a sixth p-type region,
   the first p-type region, the second p-type region, the third p-type region, the fourth p-type region, the fifth p-type region, and the sixth p-type region each being isolated from each other,
   the first n-type region and the first p-type region together comprising a first light emitting device,
   the second n-type region and the second p-type region together comprising a second light emitting device,
   the third n-type region and the third p-type region together comprising a third light emitting device,
   the fourth n-type region and the fourth p-type region together comprising a fourth light emitting device,
   the fifth n-type region and the fifth p-type region together comprising a fifth light emitting device,
   the sixth n-type region and the sixth p-type region together comprising a sixth light emitting device,
   the interconnection element comprising at least an interconnection element first n-type contact, an interconnection element second n-type contact, an interconnection element third n-type contact, an interconnection element first p-type contact, an interconnection element second p-type contact, and an interconnection element third p-type contact,
   the interconnection element first n-type contact being electrically connected to the first n-type region,
   the interconnection element second n-type contact being electrically connected to the second n-type region,
   the interconnection element third n-type contact being electrically connected to the third n-type region,
   the interconnection element first p-type contact being electrically connected to the fourth p-type region,
   the interconnection element second p-type contact being electrically connected to the fifth p-type region,
   the interconnection element third p-type contact being electrically connected to the sixth p-type region,
   the interconnection element first n-type contact being electrically connected to the interconnection element second n-type contact, the interconnection element third n-type contact, the interconnection element first p-type contact, the interconnection element second p-type contact, and the interconnection element third p-type contact.

In some embodiments according to this aspect of the present inventive subject matter:
   a contact surface of the first n-type region, a contact surface of the second n-type region, a contact surface of the third n-type region, a contact surface of the fourth n-type region, a contact surface of the fifth n-type region, and a contact surface of the sixth n-type region are all substantially coplanar with a first plane, a contact surface of the first p-type region, a contact surface of the second p-type region, a contact surface of the third p-type region, a contact surface of the fourth p-type region, a contact surface of the fifth p-type region, and a contact surface of the sixth p-type region are all substantially coplanar with a second plane, a contact surface of the interconnection element first n-type contact, a contact surface of the interconnection element second n-type contact, and a contact surface of the interconnection element third n-type contact are all substantially coplanar with a third plane, a contact surface of the interconnection element first p-type contact, a contact surface of the interconnection element second p-type contact and a contact surface of the interconnection element third p-type contact are all substantially coplanar with a fourth plane, and the first plane is substantially parallel to the second plane, the second plane is substantially parallel to the third plane, and the third plane is substantially parallel to the fourth plane.

In some embodiments according to this aspect of the present inventive subject matter, the light emitter further comprises a substrate layer, the n-type layer and the p-type layer being positioned between the substrate layer and the interconnection element.

In some embodiments according to this aspect of the present inventive subject matter, the light emitter further comprises a substrate layers, the substrate layer being positioned between the p-type layer and the interconnection element.

In a tenth aspect of the present inventive subject matter, there is provided a light emitter comprising an n-type layer and a p-type layer, the n-type layer comprising a first n-type region, a second n-type region, a third n-type region, a fourth n-type region, a fifth n-type region, and a sixth n-type region, the first n-type region, the second n-type region, the third n-type region, the fourth n-type region, the fifth n-type region, and the sixth n-type region each being isolated from each other by at least one isolation region, the p-type layer comprising a first p-type region, a second p-type region, a third p-type region, a fourth p-type region, a fifth p-type region, and a sixth p-type region, the first p-type region, the second p-type region, the third p-type region, the fourth p-type region, the fifth p-type region, and the sixth p-type region each being isolated from each other by the at least one isolation region, the first n-type region and the first p-type region together comprising a first light emitting device, the second n-type region and the second p-type region together comprising a second light emitting device, the third n-type region and the third p-type region together comprising a third light emitting device, the fourth n-type region and the fourth p-type region together comprising a fourth light emitting device, the fifth n-type region and the fifth p-type region together comprising a fifth light emitting device, the sixth n-type region and the sixth p-type region together comprising a sixth light emitting device, the light emitter further comprising a first p-contact which extends through at least part of at least one of the at least one isolation region, the first p-contact being electrically connected to the first p-type region, the light emitter further comprising a second p-contact which extends through at least part of at least one of the at least one isolation region, the second p-contact being electrically connected to the fourth p-type region.

In some embodiments according to this aspect of the present inventive subject matter, the light emitter further comprises a substrate, the n-type layer and the p-type layer being mounted on the substrate.

In an eleventh aspect of the present inventive subject matter, there is provided a light emitter comprising an n-type layer and a p-type layer, the n-type layer comprising a first n-type region, a second n-type region and a third n-type region, the first n-type region, the second n-type region, and the third n-type region each being isolated from each other by at least one isolation region, the p-type layer comprising a first p-type region, a second p-type region, and a third p-type region, the first p-type region, the second p-type region, and the third p-type region each being isolated from each other by the at least one isolation region, the first n-type region and the first p-type region together comprising a first light emitting device, the second n-type region and the second p-type region together comprising a second light emitting device, the third n-type region and the third p-type region together comprising a third light emitting device, the first light emitter further comprising a first p-contact which extends through at least part of at least one of the at least one isolation region, the first p-contact being electrically connected to the first p-type region.

In some embodiments according to this aspect of the present inventive subject matter, the first p-contact is also electrically connected to the second p-type region and the third p-type region.

In some embodiments according to this aspect of the present inventive subject matter, the light emitter further comprises a substrate, the n-type layer and the p-type layer being mounted on the substrate.

In a twelfth aspect of the present inventive subject matter, there is provided a lighting element comprising:

a first light emitter;

a second light emitter; and an interconnection element;

the first light emitter comprising a first n-type layer and a first p-type layer, the first n-type layer comprising a first light emitter first n-type region, a first light emitter second n-type region and a first light emitter third n-type region, the first light emitter first n-type region, the first light emitter second n-type region, and the first light emitter third n-type region each being isolated from each other by at least a one first light emitter isolation region, the first light emitter p-type layer comprising a first light emitter first p-type region, a first light emitter second p-type region, and a first light emitter third p-type region, the first light emitter first p-type region, the first light emitter second p-type region, and the first light emitter third p-type region each being isolated from each other by the at least one first light emitter isolation region, the first light emitter first n-type region and the first light emitter first p-type region together comprising a first light emitting device, the first light emitter second n-type region and the first light emitter second p-type region together comprising a second light emitting device, the first light emitter third n-type region and the first light emitter third p-type region together comprising a third light emitting device, the first light emitter comprising a first light emitter first p-contact which extends through at least part of at least one of the at least one first light emitter isolation region, the first light emitter first p-contact being electrically connected to the first light emitter first p-type region, the second light emitter comprising a second n-type layer and a second p-type layer, the second n-type layer comprising a second light emitter first n-type region, a second light emitter second n-type region and a second light emitter third n-type region, the second light emitter first n-type region, the second light emitter second n-type region, and the second light emitter third n-type region each being isolated from each other by at least one second light emitter isolation region, the second light emitter p-type layer comprising a second light emitter first p-type region, a second light emitter second p-type region, and a second light emitter third p-type, the second light emitter first p-type region, the second light emitter second p-type region, and the second light emitter third p-type region each being isolated from each other by the at least one second light emitter isolation region, the second light emitter first n-type region and the second light emitter first p-type region together comprising a fourth light emitting device, the second light emitter second n-type region and the second light emitter second p-type region together comprising a fifth light emitting device, the second light emitter third n-type region and the second light emitter third p-type region together comprising a sixth light emitting device, the second light emitter comprising a second light emitter first p-contact which extends through at least part of the second light emitter isolation region, the interconnection element providing:
electrical connection between the first light emitter first n-type region and the second light emitter first p-type region,
electrical connection between the first light emitter second n-type region and the second light emitter second p-type region, and
electrical connection between the first light emitter third n-type region and the second light emitter third p-type region.

In some embodiments according to this aspect of the present inventive subject matter, the interconnection element is positioned between the first light emitter and the second light emitter.

In some embodiments according to this aspect of the present inventive subject matter, the first light emitter and the second light emitter are positioned to a same side of the interconnection element.

In a thirteenth aspect of the present inventive subject matter, there is provided a lighting device, comprising:
a first light emitter; and
a second light emitter,
the first light emitter comprising a first light emitter n-type layer and a first light emitter p-type layer,
the first light emitter n-type layer comprising a first light emitter first n-type region, a first light emitter second n-type region and a first light emitter third n-type region, the first n-type region, the second n-type region and the third n-type region each being isolated from each other,
the first light emitter p-type layer comprising a first light emitter first p-type region, a first light emitter second p-type region and a first light emitter third p-type region, the first p-type region, the second p-type region and the third p-type region each being isolated from each other, the first light emitter first n-type region and the first light emitter first p-type region together comprising a first light emitting device, the first light emitter second n-type region and the first light emitter second p-type region together comprising a second light emitting device, the first light emitter third n-type region and the first light emitter third p-type region together comprising a third light emitting device, the second light emitter comprising a second light emitter n-type layer and a second light emitter p-type layer, the second light emitter n-type layer comprising a second light emitter first n-type region, a second light emitter second n-type region and a second light emitter third n-type region, the second light emitter first n-type region, the second light emitter second n-type region and the second light emitter third n-type region each being isolated from each other, the second light emitter p-type layer comprising a second light emitter first p-type region, a second light emitter second p-type region and a second light emitter third p-type region, the second light emitter first p-type region, the second light emitter second p-type region and the second light emitter third p-type region each being isolated from each other, the second light emitter first n-type region and the second light emitter first p-type region together comprising a fourth light emitting device, the second light emitter second n-type region and the second light emitter second p-type region together comprising a fifth light emitting device, the second light emitter third n-type region and the second light emitter third p-type region together comprising a sixth light emitting device, the first light emitter first n-type region being electrically connected to the second light emitter first p-type region, the first light emitter second n-type region being electrically connected to the second light emitter second p-type region, the first light emitter third n-type region being electrically connected to the second light emitter third n-type region, the first light emitter first n-type region being electrically connected to the first light emitter second n-type region and the first light emitter third n-type region, and the second light emitter first n-type region being electrically connected to the second light emitter second n-type region and the second light emitter third n-type region.

In some embodiments according to this aspect of the present inventive subject matter, the first light emitter and the second light emitter are positioned relative to each other such that the first light emitting device first n-type region, the first light emitting device second n-type region and the first light emitting device third n-type region face the second light emitting device first p-type region, the second light emitting device second p-type region and the second light emitting device third p-type region.

In some embodiments according to this aspect of the present inventive subject matter, a surface of the first light emitter n-type layer and a surface of the second light emitter p-type layer are substantially parallel to each other.

In some embodiments according to this aspect of the present inventive subject matter, the lighting device further comprises an n-contact which is electrically connected to the first light emitting device first n-type region, the first light emitting device second n-type region and the first light emitting device third n-type region.

In some embodiments according to this aspect of the present inventive subject matter, the lighting device further comprises a p-contact which is electrically connected to the second light emitting device first p-type region, the second light emitting device second p-type region and the second light emitting device third p-type region.

In some embodiments according to this aspect of the present inventive subject matter, the light emitter further comprises at least one fuse link electrically connected in series with at least one of the light emitting devices.

In some embodiments according to this aspect of the present inventive subject matter, the light emitter further comprises at least one means for opening an electrically conductive connection in series with at least one of the light emitting devices.

In a fourteenth aspect of the present inventive subject matter, there is provided a lighting device, comprising:

a first light emitter; and a second light emitter, the first light emitter comprising a first n-type layer and a first p-type layer, the first n-type layer and the first p-type layer together comprising a first light emitting device, the second light emitter comprising a second n-type layer and a second p-type layer, the second n-type layer and the second p-type layer together comprising a second light emitting device, the first n-type layer being electrically connected to the second p-type layer, the first light emitter and the second light emitter being positioned relative to each other such that the first n-type layer faces the second p-type layer. The expression "faces", as used as a verb herein (e.g., in the preceding sentence), means that if any intervening structures were eliminated, the structure which "faces" a second structure would "see" the second structure (e.g., surfaces which are oriented toward one another and which are parallel, or which together define an angle of 15 degrees, "face" each other).

In some embodiments according to this aspect of the present inventive subject matter, a surface of the first n-type layer and a surface of the second p-type layer are substantially parallel to each other.

In a fifteenth aspect of the present inventive subject matter, there is provided a lighting device, comprising:

a first light emitter;

a second light emitter; and an interconnection element, the first light emitter comprising a first light emitter n-type layer and a first light emitter p-type layer, the first light emitter n-type layer comprising a first light emitter first n-type region, a first light emitter second n-type region and a first light emitter third n-type region, the first light emitter first n-type region, the first light emitter second n-type region and the first light emitter third n-type region each being isolated from each other, the first light emitter p-type layer comprising a first light emitter first p-type region, a first light emitter second p-type region and a first light emitter third p-type region, the first light emitter first p-type region, the first light emitter second p-type region and the first light emitter third p-type region each being isolated from each other, the first light emitter first n-type region and the first light emitter first p-type region together comprising a first light emitting device, the first light emitter second n-type region and the first light emitter second p-type region together comprising a second light emitting device, the first light emitter third n-type region and the first light emitter third p-type region together comprising a third light emitting device, the second light emitter comprising a second light emitter n-type layer and a second light emitter p-type layer, the second light emitter n-type layer comprising a second light emitter first n-type region, a second light emitter second n-type region and a second light emitter third n-type region, the second light emitter first n-type region, the second light emitter second n-type region and the second light emitter third n-type region each being isolated from each other, the second light emitter p-type layer comprising a second light emitter first p-type region, a second light emitter second p-type region and a second light emitter third p-type region, the second light emitter first p-type region, the second light emitter second p-type region and the second light emitter third p-type region each being isolated from each other, the second light emitter first n-type region and the second light emitter first p-type region together comprising a fourth light emitting device, the second light emitter second n-type region and the second light emitter second p-type region together comprising a fifth light emitting device, the second light emitter third n-type region and the second light emitter third p-type region together comprising a sixth light emitting device, the interconnection element:

providing electrical connection between the first light emitter first n-type region and the second light emitter first p-type region, providing electrical connection between the first light emitter second n-type region and the second light emitter second p-type region, providing electrical connection between the first light emitter third n-type region and the second light emitter third p-type region, and providing electrical connection between the first light emitter first n-type region, the first light emitter second n-type region and the first light emitter third n-type region, the first light emitter first p-type region being electrically connected to the first light emitter second p-type region and the first light emitter third p-type region, and the second light emitter first n-type region being electrically connected to the second light emitter second n-type region and the second light emitter third n-type region.

In some embodiments according to this aspect of the present inventive subject matter, the interconnection element is positioned between the first light emitter n-type layer and the second light emitter p-type layer.

In some embodiments according to this aspect of the present inventive subject matter, the first light emitter and the second light emitter are positioned relative to each other such that the first light emitting device first n-type region, the first light emitting device second n-type region and the first light emitting device third n-type region face the second light emitting device first p-type region, the second light emitting device second p-type region and the second light emitting device third p-type region.

In some embodiments according to this aspect of the present inventive subject matter, a surface of the first light emitter n-type layer and a surface of the second light emitter p-type layer are substantially parallel to each other.

In some embodiments according to this aspect of the present inventive subject matter, the lighting device further comprises an n-contact which is electrically connected to the first light emitting device first n-type region, the first light emitting device second n-type region and the first light emitting device third n-type region.

In some embodiments according to this aspect of the present inventive subject matter, the lighting device further comprises an n-contact which is electrically connected to the second light emitting device first p-type region, the second light emitting device second p-type region and the second light emitting device third p-type region.

In a sixteenth aspect of the present inventive subject matter, there is provided a lighting device, comprising:
 a first light emitter; and
 a second light emitter;
 the first light emitter comprising a first light emitter n-type layer and a first light emitter p-type layer,
 the first light emitter p-type layer comprising a first light emitter first p-type region, a first light emitter second p-type region and a first light emitter third p-type region, the first p-type region, the second p-type region and the third p-type region each being isolated from each other,
 the first light emitter n-type layer and the first light emitter first p-type region together comprising a first light emitting device,
 the first light emitter n-type layer and the first light emitter second p-type region together comprising a second light emitting device,
 the first light emitter n-type layer and the first light emitter third p-type region together comprising a third light emitting device,
 the first light emitter further comprising a first p-contact layer, the first p-contact layer being electrically connected to the first light emitter first p-type region, the first light emitter second p-type region, and the first light emitter third p-type region,
 the first light emitter further comprising a first n-contact layer, the first n-contact layer being electrically connected to the first light emitter n-type layer;
 the second light emitter comprising a second light emitter n-type layer and a second light emitter p-type layer,
 the second light emitter p-type layer comprising a second light emitter first p-type region, a second light emitter second p-type region and a second light emitter third p-type region,
 the second light emitter first p-type region, the second light emitter second p-type region and the second light emitter third p-type region each being isolated from each other,
 the second light emitter n-type layer and the second light emitter first p-type region together comprising a fourth light emitting device,
 the second light emitter n-type layer and the second light emitter second p-type region together comprising a fifth light emitting device,
 the second light emitter n-type layer and the second light emitter third p-type region together comprising a sixth light emitting device,
 the second light emitter further comprising a second p-contact layer, the second p-contact layer being electrically connected to the second light emitter first p-type region, the second light emitter second p-type region and the second light emitter third p-type region,
 the second light emitter further comprising a second n-contact layer, the second n-contact layer being electrically connected to the second light emitter n-type layer,
 the first n-contact layer being electrically connected to the second p-contact layer.

In some embodiments according to this aspect of the present inventive subject matter: the first light emitter n-type layer comprises a first light emitter first n-type region, a first light emitter second n-type region and a first light emitter third n-type region, the first light emitter first n-type region, the first light emitter second n-type region and the first light emitter third n-type region each being isolated from each other,
 the first light emitting device comprises the first light emitter first n-type region and the first light emitter first p-type region,
 the second light emitting device comprises the first light emitter second n-type region and the first light emitter second p-type region,
 the third light emitting device comprises the first light emitter third n-type region and the first light emitter third p-type region,
 the second light emitter n-type layer comprises a second light emitter first n-type region, a second light emitter second n-type region and a second light emitter third n-type region, the second light emitter first n-type region, the second light emitter second n-type region and the second light emitter third n-type region each being isolated from each other,
 the first light emitting device comprises the second light emitter first n-type region and the second light emitter first p-type region,
 the second light emitting device comprises the second light emitter second n-type region and the second light emitter second p-type region, and
 the third light emitting device comprises the second light emitter third n-type region and the second light emitter third p-type region.

In some embodiments according to this aspect of the present inventive subject matter, the first p-contact layer and the first n-contact layer are on opposite faces of the first light emitter.

In some embodiments according to this aspect of the present inventive subject matter:
 the first p-contact layer has a first p-contact layer first surface and a first p-contact layer second surface,
 the first n-contact layer has a first n-contact layer first surface and a first n-contact layer second surface,
 the second p-contact layer has a second p-contact layer first surface and a second p-contact layer second surface,
 the second n-contact layer has a second n-contact layer first surface and a second n-contact layer second surface, and
 the first p-contact first surface, the first p-contact second surface, the first n-contact first surface, the first n-contact second surface, the second p-contact first surface, the second p-contact second surface, the second n-contact first surface and the second n-contact second surface are all substantially parallel to each other.

In some embodiments according to this aspect of the present inventive subject matter:
 the first p-contact layer has a first p-contact layer first surface and a first p-contact layer second surface,
 the first n-contact layer has a first n-contact layer first surface and a first n-contact layer second surface,
 the second p-contact layer has a second p-contact layer first surface and a second p-contact layer second surface,
 the second n-contact layer has a second n-contact layer first surface and a second n-contact layer second surface, and
 the first p-contact second surface, the first n-contact first surface, the first n-contact second surface, the second p-contact first surface, the second p-contact second surface, and the second n-contact first surface, are positioned between the first p-contact first surface and the second n-contact second surface.

In a seventeenth aspect of the present inventive subject matter, there is provided a lighting device, comprising:
a first light emitter; and
a second light emitter;
the first light emitter comprising a first light emitter p-type layer and a first light emitter n-type layer,
the first light emitter n-type layer comprising a first light emitter first n-type region, a first light emitter second n-type region and a first light emitter third n-type region, the first n-type region, the second n-type region and the third n-type region each being isolated from each other,
the first light emitter p-type layer and the first light emitter first n-type region together comprising a first light emitting device,
the first light emitter p-type layer and the first light emitter second n-type region together comprising a second light emitting device,
the first light emitter p-type layer and the first light emitter third n-type region together comprising a third light emitting device,
the first light emitter further comprising a first n-contact layer, the first n-contact layer being electrically connected to the first light emitter first n-type region, the first light emitter second n-type region, and the first light emitter third n-type region,
the first light emitter further comprising a first p-contact layer, the first p-contact layer being electrically connected to the first light emitter p-type layer;
the second light emitter comprising a second light emitter p-type layer and a second light emitter n-type layer,
the second light emitter n-type layer comprising a second light emitter first n-type region, a second light emitter second n-type region and a second light emitter third n-type region,
the second light emitter first n-type region, the second light emitter second n-type region and the second light emitter third n-type region each being isolated from each other,
the second light emitter p-type layer and the second light emitter first n-type region together comprising a fourth light emitting device,
the second light emitter p-type layer and the second light emitter second n-type region together comprising a fifth light emitting device,
the second light emitter p-type layer and the second light emitter third n-type region together comprising a sixth light emitting device,
the second light emitter further comprising a second n-contact layer, the second n-contact layer being electrically connected to the second light emitter first n-type region, the second light emitter second n-type region and the second light emitter third n-type region,
the second light emitter further comprising a second p-contact layer, the second p-contact layer being electrically connected to the second light emitter p-type layer,
the first n-contact layer being electrically connected to the second p-contact layer.

In some embodiments according to this aspect of the present inventive subject matter, the first p-contact layer and the first n-contact layer are on opposite faces of the first light emitter.

In some embodiments according to this aspect of the present inventive subject matter:

the first n-contact layer has a first n-contact layer first surface and a first n-contact layer second surface,
the first p-contact layer has a first p-contact layer first surface and a first p-contact layer second surface,
the second n-contact layer has a second n-contact layer first surface and a second n-contact layer second surface,
the second p-contact layer has a second p-contact layer first surface and a second p-contact layer second surface, and
the first n-contact first surface, the first n-contact second surface, the first p-contact first surface, the first p-contact second surface, the second n-contact first surface, the second n-contact second surface, the second p-contact first surface, the second p-contact second surface, are all substantially parallel to each other.

In some embodiments according to this aspect of the present inventive subject matter:

the first n-contact layer has a first n-contact layer first surface and a first n-contact layer second surface,
the first p-contact layer has a first p-contact layer first surface and a first p-contact layer second surface,
the second n-contact layer has a second n-contact layer first surface and a second n-contact layer second surface,
the second p-contact layer has a second p-contact layer first surface and a second p-contact layer second surface, and
the first p-contact second surface, the first n-contact first surface, the first n-contact second surface, the second p-contact first surface, the second p-contact second surface, and the second n-contact first surface, are positioned between the first p-contact first surface and the second n-contact second surface.

In an eighteenth aspect of the present inventive subject matter, there is provided a lighting device, comprising:
a first light emitter; and
a second light emitter;
the first light emitter comprising a first light emitter n-type layer, a first light emitter p-type layer and a first light emitter substrate layer,
the first light emitter n-type layer comprising a first light emitter first n-type region, a first light emitter second n-type region and a first light emitter third n-type region, the first light emitter first n-type region, the first light emitter second n-type region and the first light emitter third n-type region each being isolated from each other,
the first light emitter p-type layer comprising a first light emitter first p-type region, a first light emitter second p-type region and a first light emitter third p-type region, the first light emitter first p-type region, the first light emitter second p-type region and the first light emitter third p-type region each being isolated from each other,
the first light emitter first n-type region and the first light emitter first p-type region together comprising a first light emitting device,
the first light emitter second n-type region and the first light emitter second p-type region together comprising a second light emitting device,
the first light emitter third n-type region and the first light emitter third p-type region together comprising a third light emitting device,
the first light emitter further comprising a first p-contact layers, the first p-contact layer being electrically connected to the first light emitter first p-type region, the first light emitter second p-type region and the first light emitter third p-type region,
the first light emitter further comprising a first light emitter first n-contact region, a first light emitter second n-contact region and a first light emitter third n-contact region, the second light emitter comprising a second light emitter n-type layer, a second light emitter p-type layer and a second light emitter substrate layer, the second light emitter n-type layer comprising a second light emitter first n-type region, a second light emitter second n-type region and a second light emitter third n-type region, the second light emitter first n-type region, the second light emitter second n-type region and the second light emitter third n-type region each being isolated from each other, the second light emitter p-type layer comprising a second light emitter first p-type region, a second light emitter second p-type region and a second light emitter third p-type region, the second light emitter first p-type region, the second light emitter second p-type region and the second light emitter third p-type region each being isolated from each other, the second light emitter first n-type region and the second light emitter first p-type region together comprising a fourth light emitting device, the second light emitter second n-type region and the second light emitter second p-type region together comprising a fifth light emitting device, the second light emitter third n-type region and the second light emitter third p-type region together comprising a sixth light emitting device, the second light emitter further comprising a second p-contact layer, the second p-contact layer being electrically connected to the second light emitter first p-type region, the second light emitter second p-type region and the second light emitter third p-type region, the second light emitter further comprising a second light emitter first n-contact region, a second light emitter second n-contact region and a second light emitter third n-contact region, the first light emitter first n-contact region being electrically connected to the first light emitter first n-type region and the second light emitter p-contact layer, the first light emitter second n-contact region being electrically connected to the first light emitter second n-type region and the second light emitter p-contact layer, the first light emitter third n-contact region being electrically connected to the first light emitter third n-type region and the second light emitter p-contact layer.

In some embodiments according to this aspect of the present inventive subject matter, the first p-contact layer is on an opposite face of the first light emitter with respect to the first light emitter first n-contact region, the first light emitter second n-contact region, and the first light emitter third n-contact region.

In some embodiments according to this aspect of the present inventive subject matter:

the first p-contact has a first p-contact first surface and a first p-contact second surface, the second p-contact has a second p-contact first surface and a second p-contact second surface, and the first p-contact first surface, the first p-contact second surface, the second p-contact first surface and the second p-contact second surface are all substantially parallel to each other In a nineteenth aspect of the present inventive subject matter, there is provided a structure comprising:

a monolithic n-type layer comprising a plurality of n-type regions;

a monolithic p-type layer comprising a plurality of p-type regions;

the n-type regions each being isolated from each other by at least one isolation region;

the p-type regions each being isolated from each other by the at least one isolation region;

the n-type regions being positioned relative to each other in a manner which would prevent dicing the n-type layer into individual n-type regions with a conventional wafer cutting device.

In a twentieth aspect of the present inventive subject matter, there is provided a structure comprising:

a monolithic n-type layer comprising a plurality of n-type regions;

a monolithic p-type layer comprising a plurality of p-type regions;

the n-type regions each being isolated from each other by at least one isolation region;

the p-type regions each being isolated from each other by the at least one isolation region;

at least one of the n-type regions extending across a line defined by at least one of the at least one isolation region extending between at least two other n-type regions.

In some embodiments of the present inventive subject matter, the light emitter further comprises at least one fuse link electrically connected in series with at least one of the light emitting devices.

In some embodiments of the present inventive subject matter, the light emitter further comprises at least one means for opening an electrically conductive connection in series with at least one of the light emitting devices.

BRIEF DESCRIPTION OF THE DRAWINGS

FIG. 4 is a cross-sectional schematic of a plurality of light emitting diode devices on a common substrate interconnected by a submount to provide a monolithic light emitter.

FIG. 5 is a schematic representation of an interconnection of individual light emitting devices within a monolithic light emitter.

FIG. 12 is a cross-sectional schematic of a plurality of light emitting diode devices on a common substrate with "back-side" contacts.

FIG. 13 is a cross-sectional schematic of a plurality of light emitting diode devices on a common substrate with "back-side" contacts according to alternative embodiments.

DETAILED DESCRIPTION OF THE INVENTION(S)

Figure 1:
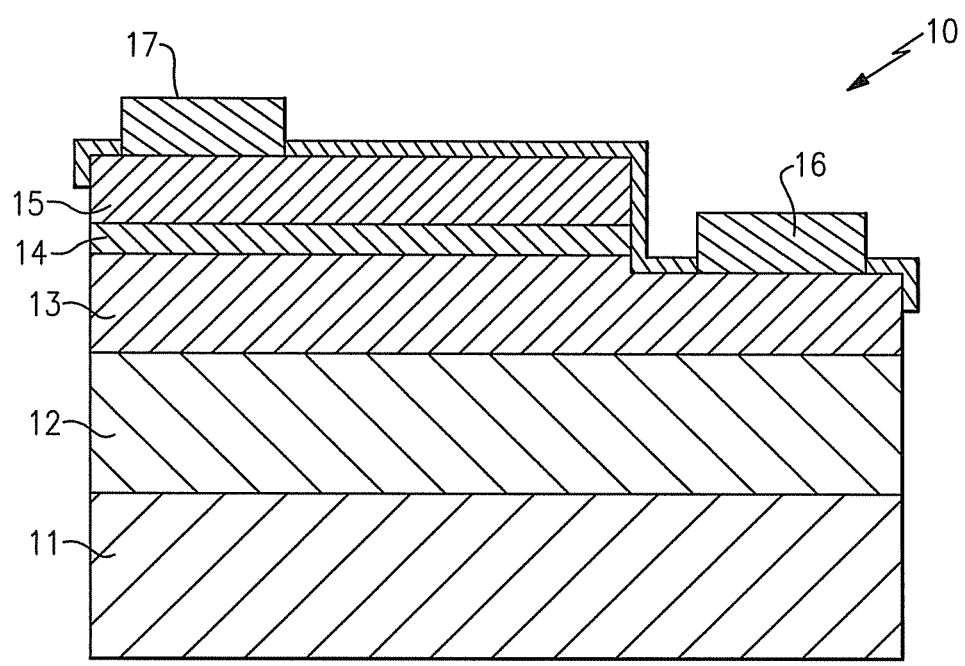
FIG. 1 is a cross-sectional schematic of a conventional light emitting diode.

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As noted above, the various aspects of the present inventive subject matter include various combinations of electronic components (transformers, switches, diodes, capacitors, transistors, etc.). Persons skilled in the art are familiar with and have access to a wide variety of such components, and any of such components can be used in making the devices according to the present inventive subject matter. In addition, persons skilled in the art are able to select suitable components from among the various choices based on requirements of the loads and the selection of other components in the circuitry.

A statement herein that two components in a device are "electrically connected," means that there are no components electrically between the components, the insertion of which materially affect the function or functions provided by the device. For example, two components can be referred to as being electrically connected, even though they may have a small resistor between them which does not materially affect the function or functions provided by the device (indeed, a wire connecting two components can be thought of as a small resistor), likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board or another medium, are electrically connected.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, an implanted region illustrated or described as a rectangle will, typically, have rounded or curved features.

Thus, the regions illustrated in the figures are schematic in nature and their shapes are not intended to illustrate the precise shape of a region of a device and are not intended to limit the scope of the present inventive subject matter.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

According to the present inventive subject matter, there is provided a higher voltage, lower current device, so that system benefits can be obtained. While the discussion herein frequently refers to light emitting diode devices, the present inventive subject matter is applicable to all types of light emitting devices, a variety of which are well-known to those skilled in the art. The light emitting devices can be any desired component which is capable of emitting light upon being supplied with electricity, e.g., solid state light emitting devices, including inorganic and organic light emitting devices. Examples of types of such light emitting devices include a wide variety of light emitting diodes (inorganic or organic, including polymer light emitting diodes (PLEDs)), laser diodes, thin film electroluminescent devices, light emitting polymers (LEPs), a variety of each of which are well-known in the art.

In particular embodiments of the present inventive subject matter, the light emitting devices are light emitting diode devices. In some embodiments, the light emitting diode devices are isolated from one another by one or more insulating region(s), in other embodiments, the light emitting diode devices are isolated from one another by one or more trench(es), and in still further embodiments, the light emitting diode devices are isolated by both one or more trench(es) and one or more insulating region(s). The light emitting diode devices may be lateral devices, vertical devices or some of each.

According to the present inventive subject matter, instead of using a single P/N junction, the device is made into multiple regions so that each isolated region can be series connected to obtain the desired series-parallel arrangements that provide high voltage operation and fault tolerance in the device. In this way, a large area (single component) can be used with the benefit of placing (or packaging) fewer chips while still obtaining the best overall system performance.

Some embodiments of the inventive subject matter use flip-chip technology to mount a large area multi-light emitting device to a submount having electrical interconnection formed in and/or on the submount. As used herein, the term "light emitting device" refers to an individual light emitting structure (e.g., a light emitting diode structure) that may be separately electrically connected to other light emitting diode structures in a series and/or parallel configuration. The multiple light emitting devices remain mechanically connected to each other, for example, by a common substrate, and are not singulated but provide a monolithic structure of multiple independently electrically connectable light emitting device structures. Because in these embodiments, the individual light emitting devices will be electrically interconnected by flip-chip mounting to a submount, preferably, each light emitting device includes both anode and cathode contacts on the same side of the monolithic structure.

In accordance with the present inventive subject matter, there is provided a light emitter which comprises a plurality of light emitting devices which are mechanically interconnected to one another (e.g., on a common substrate on which the devices were formed).

The interconnection electrically connects the mechanically connected light emitting devices to provide a "high voltage" monolithic large area structure, in which the light emitting devices are electrically interconnected to provide an array of at least two serially connected subsets of light emitting devices, each subset comprising at least three light emitting devices electrically connected in parallel.

Figure 2:
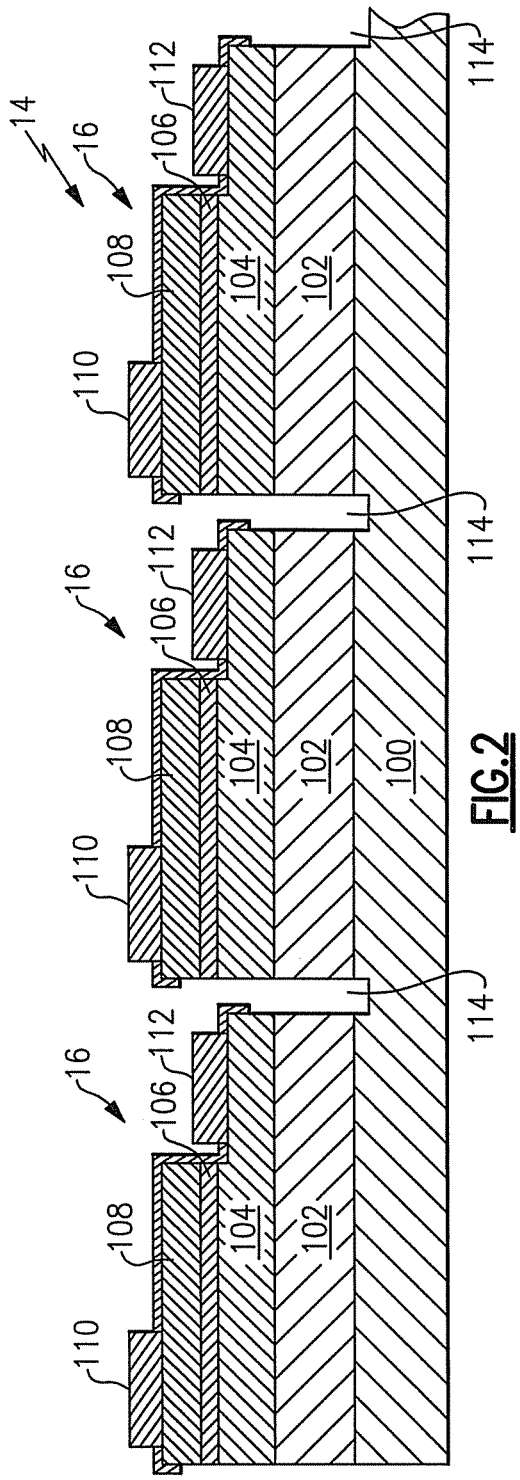
FIG. 2 is a cross-sectional schematic of a plurality of light emitting diode devices on a common substrate utilizing a first isolation technique.
Figure 3:
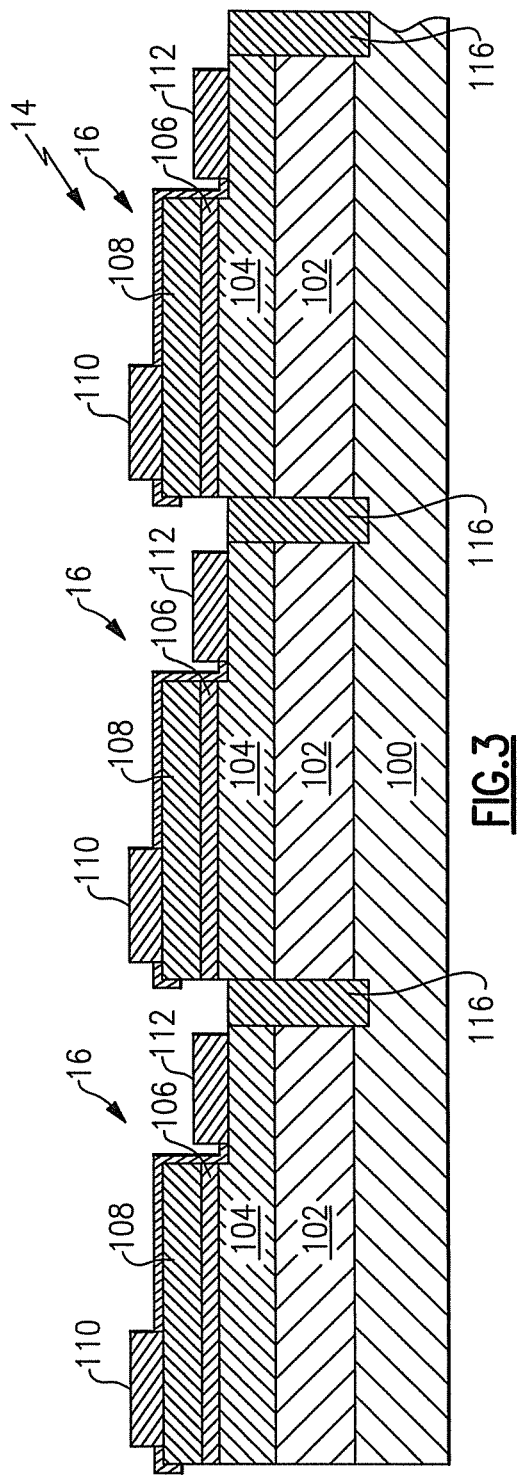
FIG. 3 is a cross-sectional schematic of a plurality of light emitting diode devices on a common substrate utilizing a second isolation technique.

FIGS. 2 and 3 are schematic cross-sections of pluralities of light emitting devices, in this embodiment, light emitting diodes. The individual light emitting diode devices may have any desired light emitting diode device configuration, including the configuration described above with reference to FIG. 1. As seen in FIGS. 2 and 3, the individual light emitting devices 16 remain on the substrate 100 to provide a plurality of separate light emitting diode devices 16 that are physically connected by the common substrate 100. Because the light emitting diode devices 16 are to be flip-chip mounted such that light is extracted through the substrate 100, the substrate 100 should be substantially transparent. For example, the substrate 100 may be sapphire, spinel, semi-insulating or insulating SiC, semi-insulating or insulating Si, semi-insulating or insulating GaN, semi-insulating or insulating ZnO, or semi-insulating or insulating AlN. The substrate material will, typically, be selected based on light emitting diode device material selection.

FIGS. 2 and 3 illustrate two techniques for defining the individual light emitting diode devices 16. In particular, FIG. 2 illustrates trench isolation and FIG. 3 illustrates ion implantation to make the implanted regions semi-insulating or insulating Referring to FIG. 2, the trench isolation may be provided by etching, laser scribing, sawing or otherwise forming a trench 114 that extends through the active layers of the p-contact layer 108, the quantum wells 106 and the n-contact layer 104 and to/through the buffer layer 102 to the substrate 100 to isolate individual devices. In some embodiments, the trench extends into the substrate 100 as illustrated in FIG. 2. In other embodiments with an insulating buffer layer, the trench may only extend to the buffer layer 102. Furthermore, the trench may also be filled with an insulator, such as an oxide or nitride (e.g. $SiO_2$ or SiN).

FIG. 3 illustrates an alternative technique for isolating individual devices. In FIG. 3, ion implanted regions 116 define the peripheries of the individual devices 16. The ion implanted regions are semi-insulating or insulating. As with the trench 114, the ion implanted regions 116 extend through the active layers of the device and, in some embodiments, into the substrate 100.

The die which includes a plurality of isolated light emitting devices 16, is separated from a wafer to provide a monolithic structure that includes a plurality of light emitting devices 16. This separation process may, for example, be carried out by sawing, scoring and breaking or other techniques known to those of skill in the art for separating die within a wafer.

The substrate 100 may also be thinned, laser patterned, etched or subjected to chemical mechanical polishing (CMP), or in some embodiments completely removed. For example, as illustrated in FIG. 4, light extraction features 120 may also be provided on the substrate 100 to improve extraction of light through the substrate 100. In particular embodiments, the light extraction features 120 approximate a "moth eye" structure. In other embodiments, other light extraction features 120 may also be provided. Various light extraction features are known to those of skill in the art. Techniques for patterning the substrate 100 for light extraction are also known to those of skill in the art.

In addition, the light emitting devices 16 may also include one or more phosphors or other luminous materials on the substrate 100. Such luminous material materials may be provided on the substrate 100. For example, a YAG phosphor may be provided in a glob or conformal application on the substrate 100.

FIG. 4 illustrates embodiments of the present inventive subject matter for electrically interconnecting the mechanically connected light emitting devices 16 on the common substrate 100. As seen in FIG. 4, an interconnection submount assembly 200 includes a submount substrate 202 with optional mirror and insulating layers 204 and 206. Electrically conductive contacts 210 and 212 and interconnects are provided on the insulator layer 206 to electrically connect the light emitting devices 16 when mounted to the submount assembly 200. The interconnects connect the light emitting devices 16 in the two dimensional array discussed above and schematically illustrated in FIG. 5.

The light emitting diode devices 16 may be mounted utilizing, for example, solder bump technology, gold bump technology, conductive epoxies, eutectic bonding or other techniques known to those of skill in the art.

The submount substrate 202 may be any substrate material that provides suitable structural rigidity including, for example, semi-insulating Si, semi-insulating SiC, semi-insulating diamond, CuMo, Ge, metal alloy, metal oxides, Cu, Al, steel with insulator and/or PCB materials, a thermally conductive plastic with or without filled, BN, a transparent ceramic (very small grain size ceramic) or other insulating materials, such as BeO. Preferably, the submount substrate has a high thermal conductivity so as to aid in dissipating heat from the light emitting diode devices. In some embodiments, the submount assembly 200 itself could be a large area light emitting diode device.

The insulator layer 206 may, for example, be an insulating metal oxide (e.g., AlOx), an organic such as fiberglass, a high temperature resin, glass, an insulating or semi-insulating semiconductor, SiN, SiOx, $Ta_2O_5$. The mirror layer 204 may be any suitable reflective material and may, in some embodiments, be provided by the insulator layer 206 itself. The insulator layer 206 may also be provided by more than one layer, for example, Bragg reflectors may be incorporated into the insulator layers to provide a mirror. In other embodiments, the mirror layer 204 may be provided by an Al layer or other such reflective material.

The interconnection between contact pads 210 and 212 for the respective light emitting diode device contacts 110 and 112 may be provided as a metallization or other conductive pattern in/on the submount. For example, the interconnection could be provided as an aluminum pattern on the insulator layer 206. Alternatively or additionally, the interconnection could be provided as a conductive pattern within the insulator layer 206, for example, through the use of a damascene process where trenches are formed in the insulator layer 206, a metal layer is formed on the insulator layer 206 and in the trenches, and the metal layer is then planarized to remove portions of the metal layer that are not in the trenches, thus providing an interconnection pattern in the trenches. Alternatively, ITO (Indium and Tin Oxides) may be used as electrical conductive transparent interconnects.

By mounting the substrate 100 to the submount 200, a light emitter 10 is provided as a monolithic large area light emitter having the interconnection scheme illustrated in FIG. 5.

As is seen in FIG. 5, the light emitting diode devices 16 are connected in parallel subsets 12 that form "rows" in the array of devices. These rows of parallel diodes are connected in series to provide the high voltage light emitter 10. As discussed above, the interconnection of the diodes illustrated in FIG. 5 provides a high voltage device that may reduce $I^2R$ losses, provide fault tolerance, improve device yields and allow for more efficient power supply designs.

Figure 7:
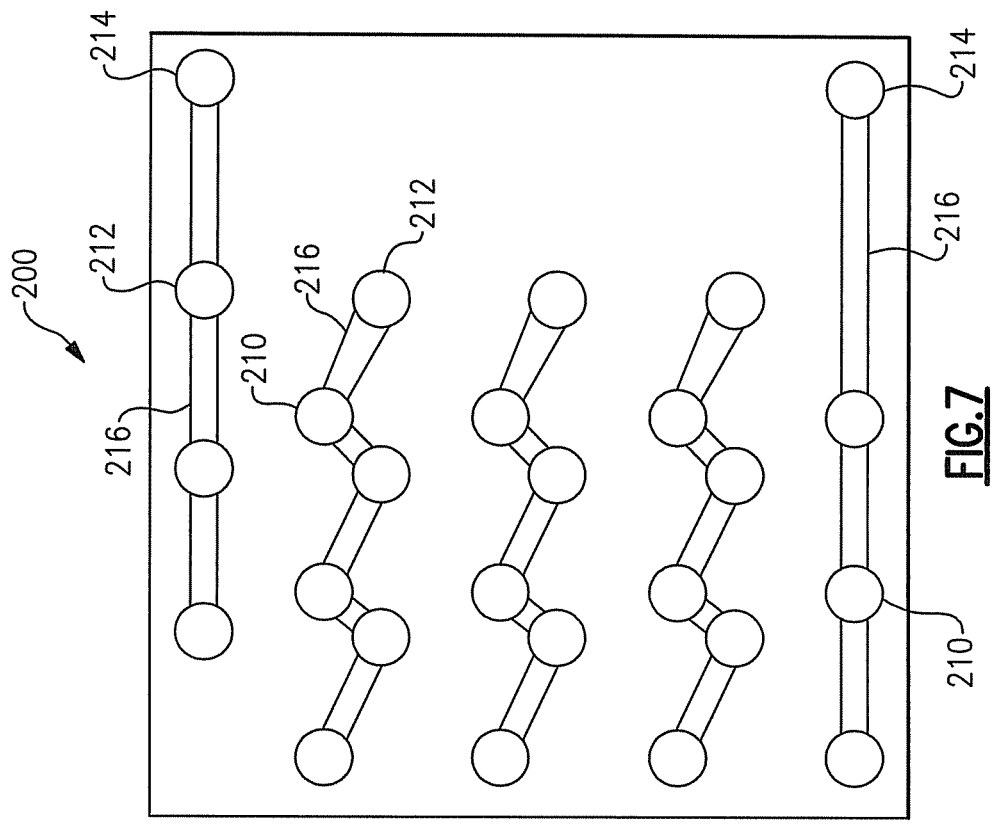
FIG. 7 is a top view of an electrical interconnection on a submount suitable for use with the plurality of mechanically connected light emitting diode devices on the common substrate illustrated in FIG. 6.
Figure 6:
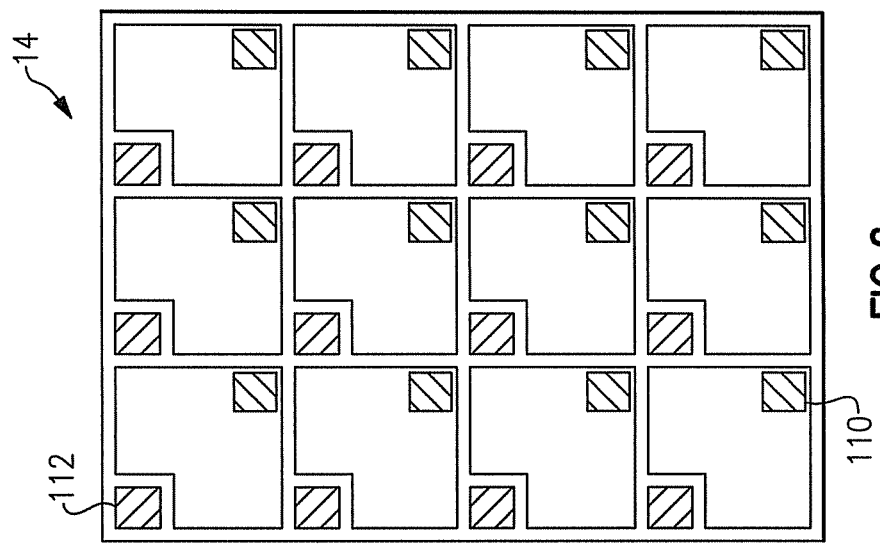
FIG. 6 is top view of a plurality of mechanically connected light emitting diode devices on a common substrate.

FIGS. 6 through 9 are top views of submounts 200 and mechanically connected light emitting diode devices 16. In FIG. 6, the wafer portion 14 containing individual light emitting diode devices 16 have anode and cathode contacts 112 and 110 on opposite corners of the devices 16. The interconnection suitable for providing a monolithic high voltage light emitter 10 are illustrated in FIG. 7. As seen in FIG. 7, anode contact pads 212 and cathode contact pads 210 are configured such that the anodes 112 of subsequent devices in subsequent rows are connected to the cathode 110 of devices in previous rows by the diagonal interconnection patterns 216. The anodes 112 of devices in a first row of the device 10 are connected together to provide an anode contact 214 for the monolithic light emitter. The cathode contacts 110 of the last row of devices in the array are also connected together to provide a cathode contact 214 for the monolithic light emitter.

Figure 9:
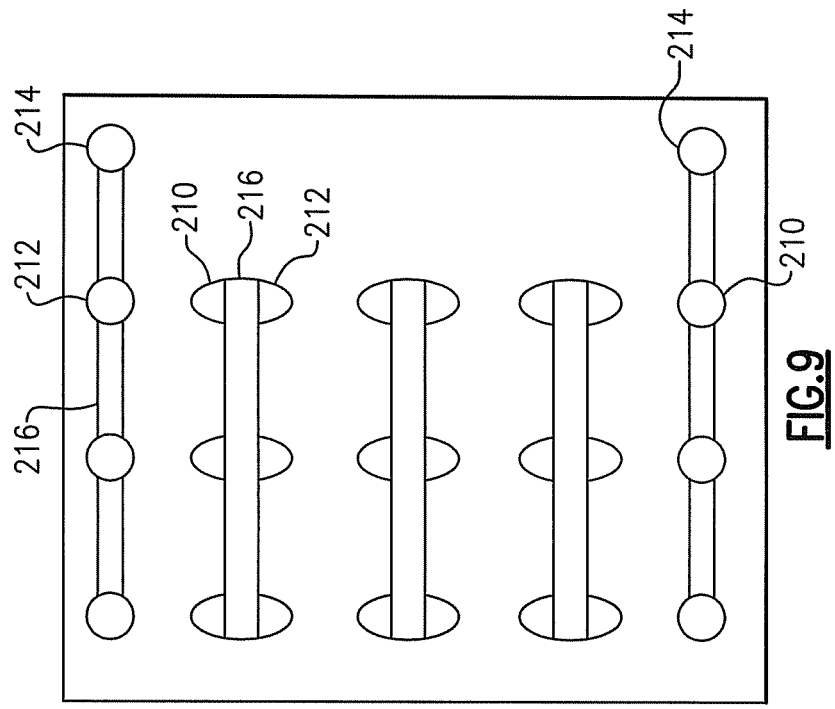
FIG. 9 is a top view of an electrical interconnection on a submount suitable for use with the plurality of mechanically connected light emitting diode devices on the common substrate illustrated in FIG. 8.
Figure 8:
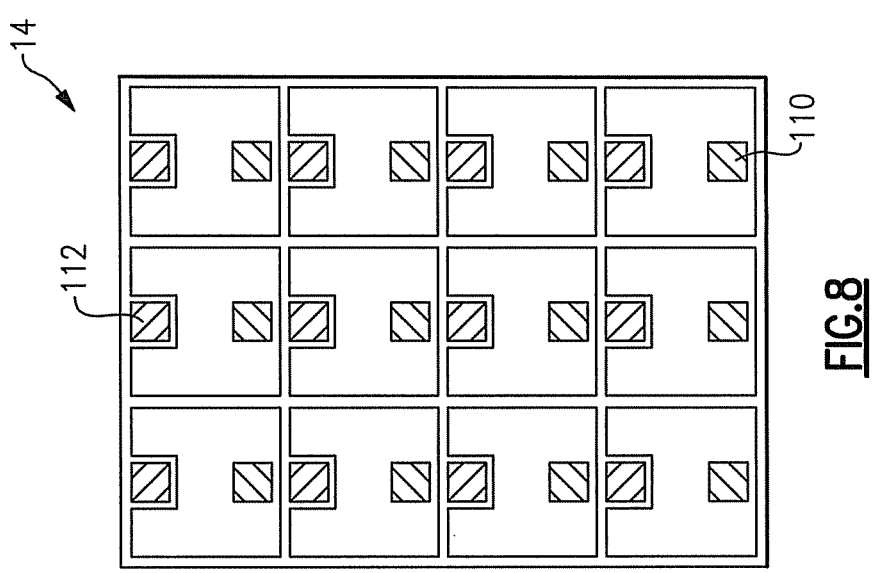
FIG. 8 is top view of a plurality of mechanically connected light emitting diode devices on a common substrate.

In FIG. 8, the individual light emitting diode devices 16 of the wafer portion 14 have anode and cathode contacts 112 and 110 disposed opposite each other on the devices 16. As seen in FIG. 9, this configuration of the contacts 112 and 110 may simplify the interconnection on the submount by allowing adjacent anode and cathode contacts 112 and 110 to be directly connected to each other by the contact pads 210 and 212 and the contacts of adjacent rows connected together by the interconnection 216.

Figure 10:
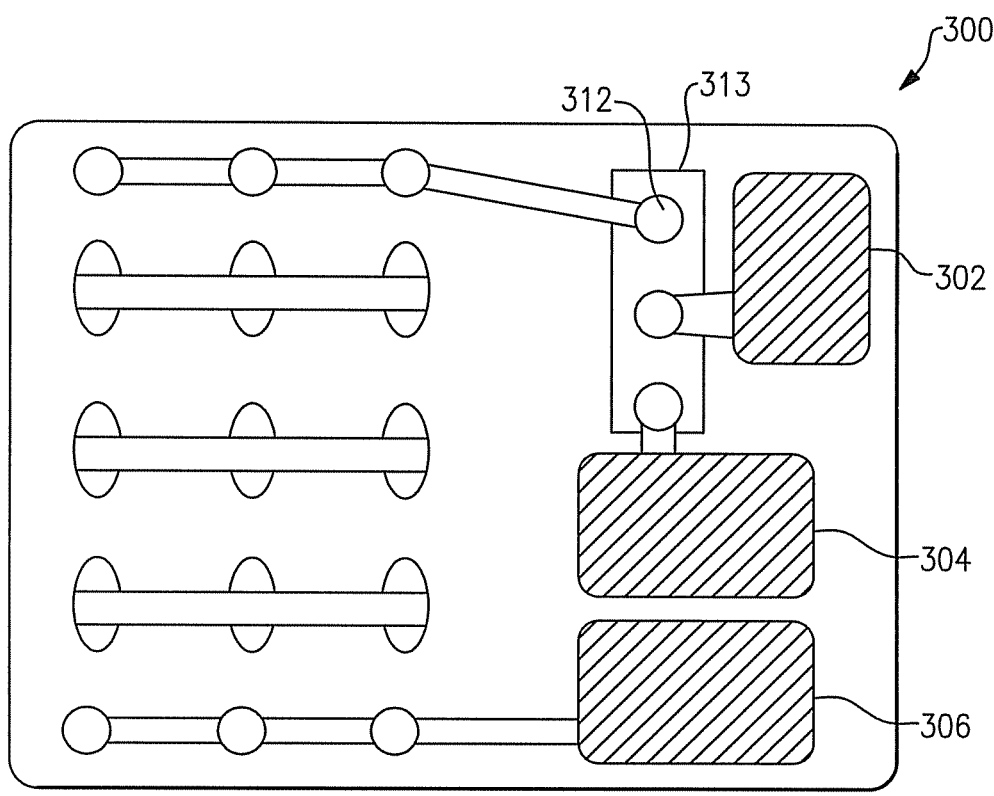
FIG. 10 is a top view of an electrical interconnection on a submount that also includes additional circuitry to drive a monolithic light emitter.

FIG. 10 illustrates a high voltage light emitter where additional electrical circuitry, such as a drive transistor, is included on the submount assembly 300. As seen in FIG. 10, three contacts 302, 304 and 306 are provided to connect a transistor to the monolithic large area light emitter. A source contact 312 of a transistor may be connected to the cathode or anode of the monolithic large area light emitter. The other of the anode or cathode of the monolithic large area light emitter may be connected to a supply voltage or reference voltage (such as ground, possibly through a sense resistor which may also be provided on the submount) and the drain contact of the transistor connected to the other of the supply voltage or the reference voltage. A third contact 302 is provided for the gate of the transistor to control current flow through the monolithic large area light emitter. Additional components, such as capacitors, resistors and/or inductors, may also be provided on the submount to further facilitate operation of the monolithic large area light emitter. Such additional components can be attached to the submount or alternatively be fabricated as part of the submount in the case of the submount being a semi-conductor material such as silicon or germanium. Other electrical circuits, such as electro-static discharge protection circuits, may also be provided.

Figure 11:
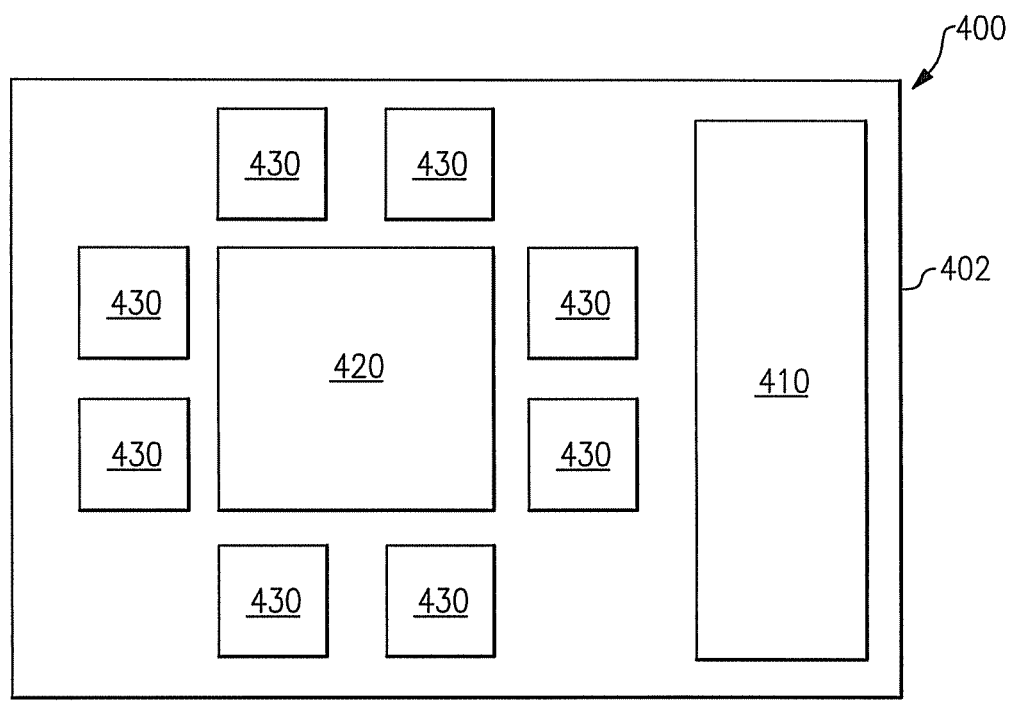
FIG. 11 is a top view of a self-contained element including a monolithic light emitter, additional lighting devices and power supply circuitry on a submount.

FIG. 11 illustrates a self-contained high voltage light emitter 400. As seen in FIG. 11, the monolithic large area light emitter 420 may be provided on the submount 402 with additional light emitting devices 430. Additionally, power supply circuitry 410 may also, optionally, be provided on the submount 402. The power supply circuitry 410 may be an AC or DC power supply. The light emitting devices 430 and the monolithic large area light emitter 420 may be provided, for example, to provide the white light emitting system described in U.S. Pat. No. 7,213,940.

For example, the light emitter 400 may also include a submount 402 comprising an array of light emitting diode devices of one color 430 and a region of interconnects onto which is attached a monolithic array of light emitting diode devices of another color 420 and may also include a region of transistors and diodes and components to form part or all of a power supply 410 or control circuit. For example, the submount may comprise a GaAs or GaP layer with regions, such regions being delineated areas, including a region comprising layers of AlAs or AlInGaP or AlGaAs forming red orange or yellow light emitting diode devices or arrays of light emitting diode devices and interconnected, and preferably another region(s) where a monolithic arrays of blue and/or green and or cyan and or yellow light emitting diode devices can be mounted.

The embodiments described above provide for flip-chip mounting of the light emitting diode devices on the submount. However, in alternative embodiments, the light emitting diode devices may be mounted substrate side down to the submount. Such embodiments may utilize devices with, for example, a conducting substrate, such as a SiC substrate, with a via from the top side of the device to the back side of the device to provide both contacts on the same side of the device. Examples of such devices are illustrated in FIGS. 12 and 13. Alternatively, multiple vias could be utilized to move both top side contacts to the back side of the device if, for example, an insulating or semi-insulating substrate is used as described above.

As seen in FIGS. 12 and 13, a p contact 516 is provided on the backside of each device through a via 514 with insulating sidewalls. The insulating sidewalls prevent the contact from shorting across the P/N junction and the quantum wells. Thus, via 514 extends through the p-type layer 508, the quantum wells 506, the n-type layer 504, the buffer layer 502 and the substrate 500. The vias may be placed in the isolation region between light emitting diode devices so as to maximize the active area of the individual devices. Alternatively, the via could be placed through the active region of the device. In such a case, the isolation regions should still extend through the active regions of the device, i.e. the substrate, if the substrate is a conducting substrate, so as to allow for individual electrical connection of the light emitting diode devices.

In the devices illustrated in FIG. 12, the electrical interconnection of individual light emitting diode devices is provided by the submount. Thus, an electrical interconnection scheme such as illustrated in FIGS. 7 and 9 could be utilized. As seen in FIG. 12, the p-contact 516 can extend onto the p-type contact layer 508 or, alternatively or additionally, the p-contact 516 may be made on the sidewall of the p-type contact layer 508. Such a device may have a planar top surface and could maximize active area and reduce light obscuration by a contact. In any case, the periphery of the light emitting diode device could be ringed by the p-contact 516 so as to increase the surface area where the p-contact 516 is in contact with the p-type contact layer 508. In such a case, a non-conductive region 514 could be provided between adjacent light emitting diode devices so as to isolate the p-contacts of the mechanically connected devices.

In the devices illustrated in FIG. 13, electrical connection between mechanically connected devices within a row is made by the p-contact or adjacent devices. Mechanically connected devices from other rows would be isolated by a non-conductive region between the mechanically connected devices so that the array structure described above could be provided.

While not illustrated in FIGS. 12 and 13, an insulating layer could be provided on the back side of the wafer and contact holes opened in the insulating layer. Contact metal could then be filled into the contact holes to provide the p and n contacts illustrated. Such a metal contact could be provided by the damascene process described above and may provide a substantially planar surface for mounting to the submount.

Figure 14:
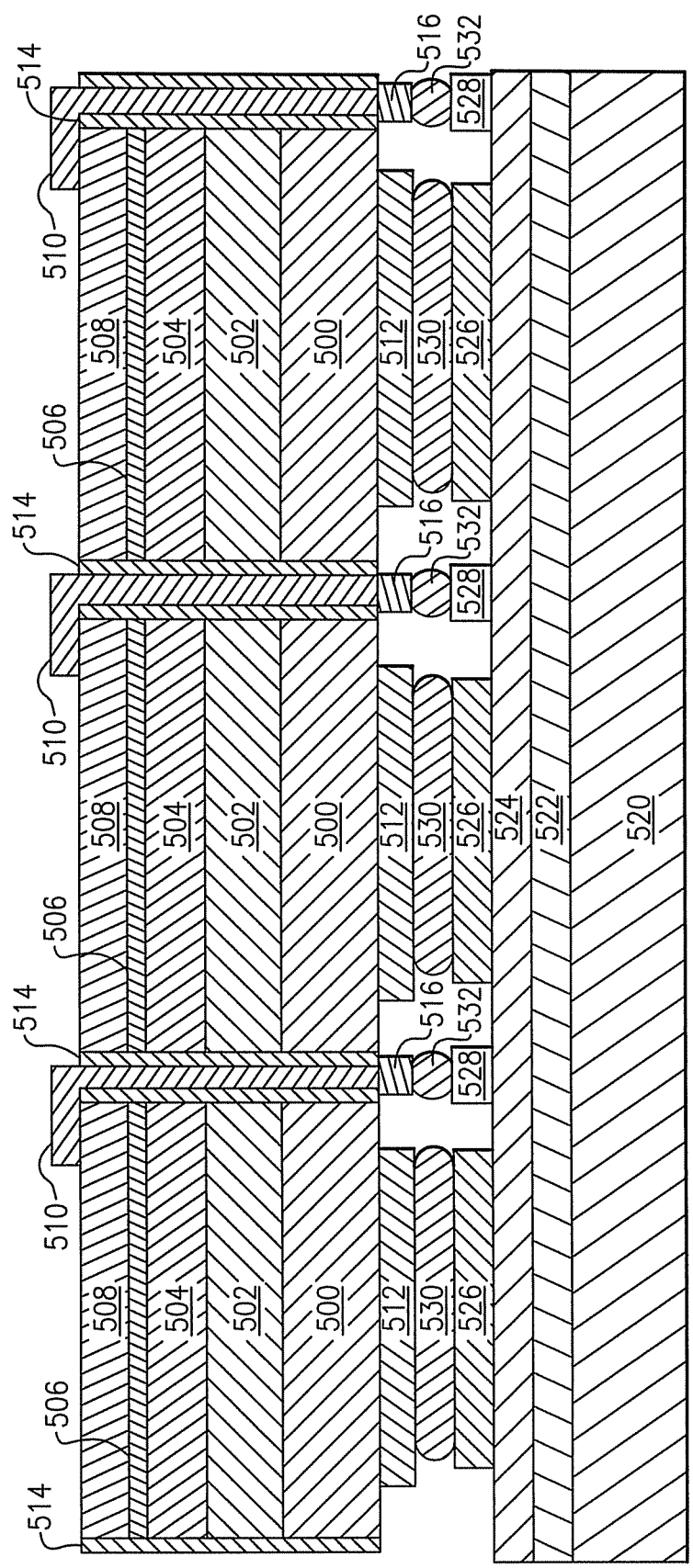
FIG. 14 is a cross-sectional schematic of a plurality of light emitting diode devices on a common substrate interconnected by a submount to provide a monolithic light emitter.

FIG. 14 illustrates the devices of FIGS. 12 and 13 mounted on a submount to provide electrical interconnection into the array described above with reference to FIG. 5. As seen in FIG. 14, electrical contacts 526 and 528 and electrical interconnection may be provided on a submount substrate 520. The submount substrate 520 may be provided as any of the submount substrates discussed above. Likewise, the optional insulating and/or mirror layers 522 and 524 may also be provided as discussed above. The light emitting diode devices may be mounted on the submount substrate 520 through, for example, solder bumps 530 and 532 or other bonding technology between the p and n contacts 516 and 512 and the electrical contacts 526 and 528.

In addition to the electrical/mechanical bonding between the mechanically connected light emitting diode devices and the submount, a thermal connection material may also be provided. The thermal connection may be provided by the electrical and mechanical connection material or may be provided by a separate material. In some embodiments, an electrically non-conductive thermal material may be provided between the submount and the mechanically connected light emitting diode devices to improve heat extraction from the light emitting diode devices through the submount. Such a thermal material may also improve mechanical connection between the submount and the light emitting diode devices, and may also provide improved optical reflection or extraction from the light emitter. Examples of suitable materials include silicones or similar materials which may include particles or nanoparticles of thermally conductive material such as $SiO_2$, AlOx, SiC, BeO, ZO.

Figure 15:
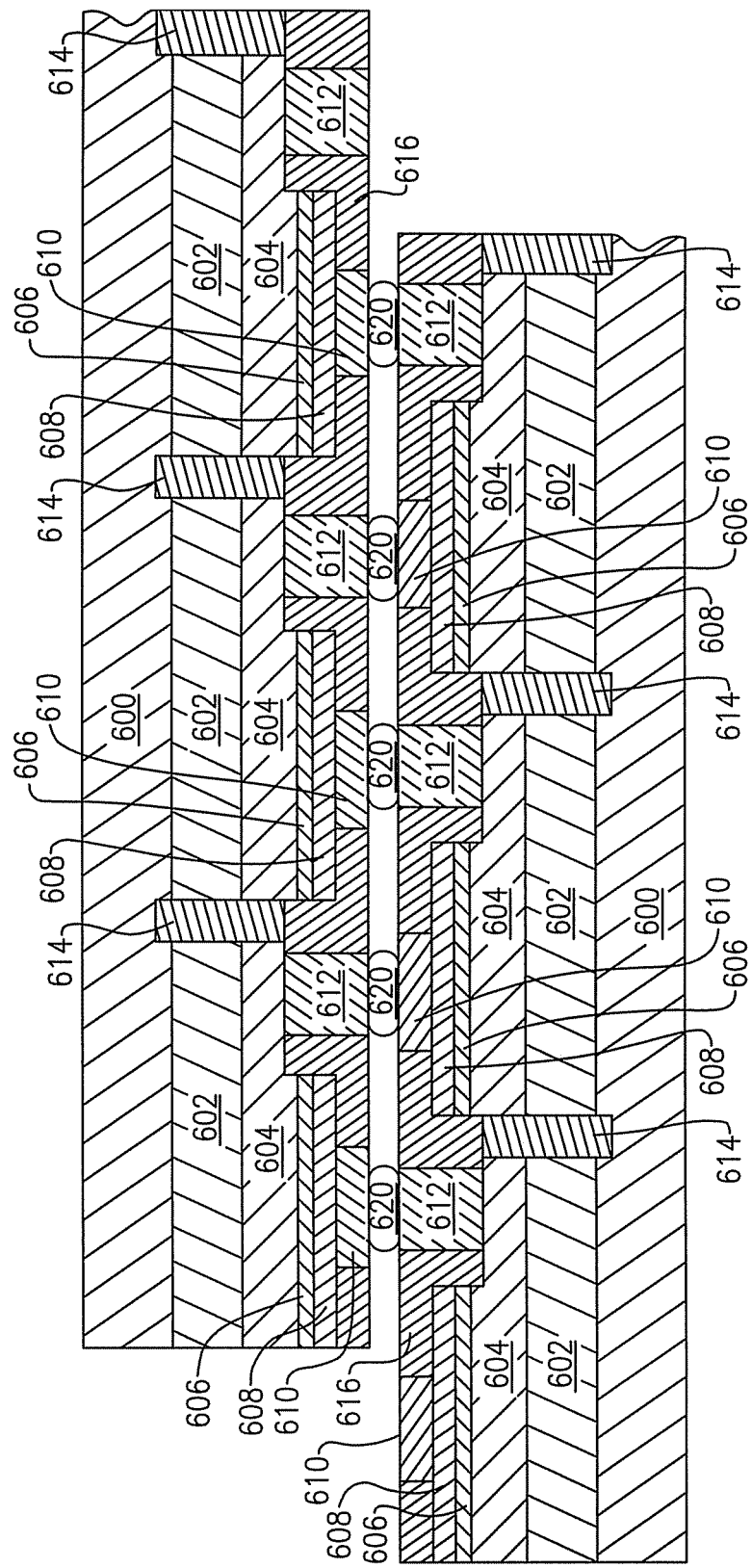
FIG. 15 is a cross-sectional schematic of two common substrates electrically interconnected by mounting one substrate on the other.

FIG. 15 illustrates an interconnection of light emitting diode devices according to further embodiments of the present inventive subject matter. In the device of FIG. 15, two substrates 600 each mechanically interconnect corresponding sets of light emitting diode devices. The two substrates 600 are then mounted together such that anode contacts 610 of one set of light emitting diode devices on a first substrate 600 are electrically connected to cathode contacts 612 of a second set of light emitting diode devices on the second substrate 600. A first wire bond or other connection could be made to the first anode contact (on the left side of FIG. 15) and a second wire bond or other connection could be made to the last cathode contact (on the right side of FIG. 15). This would interconnect the light emitting diode devices of the two substrates into a series string of light emitting diode devices with an input at the first anode contact and an output at the last cathode contact. Otherwise, the buffer layer 602, the n-type layer 604, the quantum wells 606, the p-type layer 608 and the isolation regions 614 may be as described above with reference to any of the light emitting diode devices. Conductive regions 620

(e.g., solder regions, such as silver epoxy) are provided to provide electrical connection, and in some embodiments also mechanical bonding.

Figure 16:
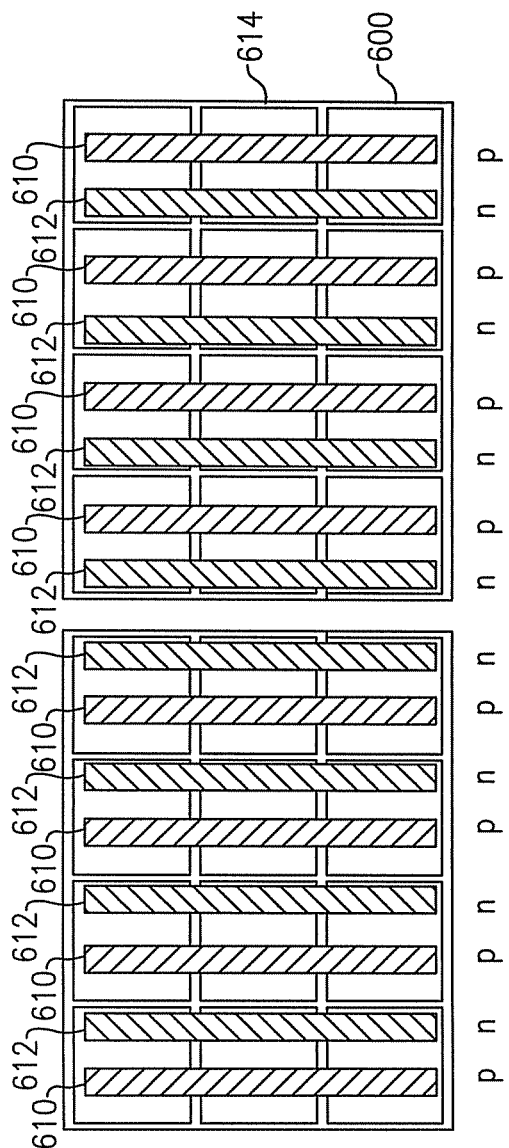
FIG. 16 is a top plan view of the two common substrates of FIG. 15 before mounting.
Figure 17:
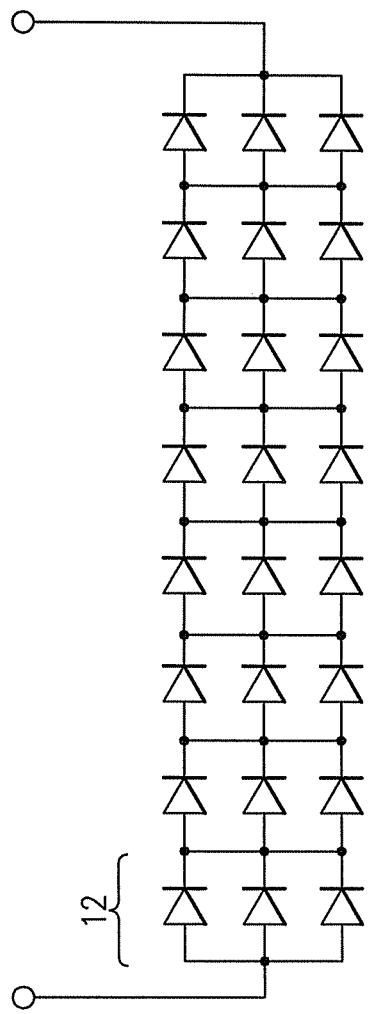
FIG. 17 is a circuit diagram of the interconnected substrates of FIG. 15.

In order to provide parallel sets of light emitting diode devices in the series string, the light emitting diode devices in a given row on the two substrates 600 could be electrically interconnected by a metallization or shared p-contact layer in the dimension extending into and out of the page in FIG. 15. Such a potential electrical interconnection structure is seen in the top plan view of FIG. 16. In FIG. 16, adjacent light emitting diode devices have their respective anodes and cathodes 610 and 612 electrically coupled together such that when one of the two substrates 600 is flipped and mounted on the other (offset so that the anodes and cathodes line up) rows of parallel light emitting diode devices are electrically connected in series. Thus, by mounting one substrate on the other, an electrical circuit corresponding to that illustrated in FIG. 17 is provided.

Figure 18:
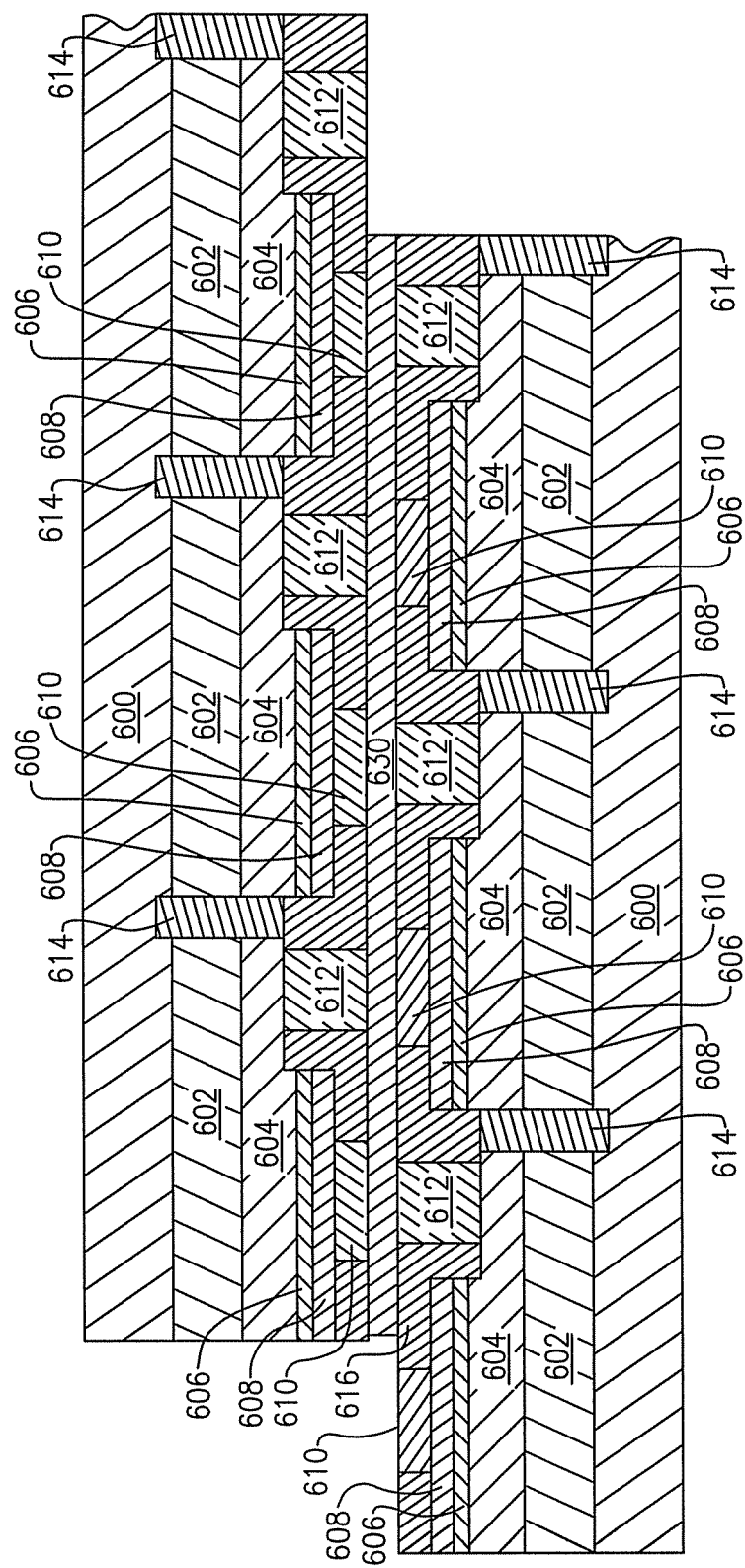
FIG. 18 is a cross-sectional schematic of two common substrates electrically interconnected by mounting each on an interconnect disposed between the two substrates.

FIG. 18 illustrates an embodiment of the present inventive subject matter where an interconnect layer 630, for example transparent or reflective, is provided between the substrates 600. The substrates 600 may be mechanically and electrically connected to the interconnect layer 630 such that the individual light emitting diode devices on the substrates are electrically connected in the array structure described herein. In such a case, the electrical interconnection between light emitting diode devices illustrated in FIG. 16 need not be provided and individual light emitting diode devices mechanically connected by a common substrate may be utilized. Suitable materials for such an interconnection layer 630 may be transparent ceramics, transparent oxides or transparent semi-conductors (insulating or semi-insulating) or glass with electrically conductive traces, such as Al, Au or the like, formed therein, or other materials known to those of skill in the art. The interconnect layer 630 may be one or more layers, as described herein with respect to the submount 200.

Figure 19:
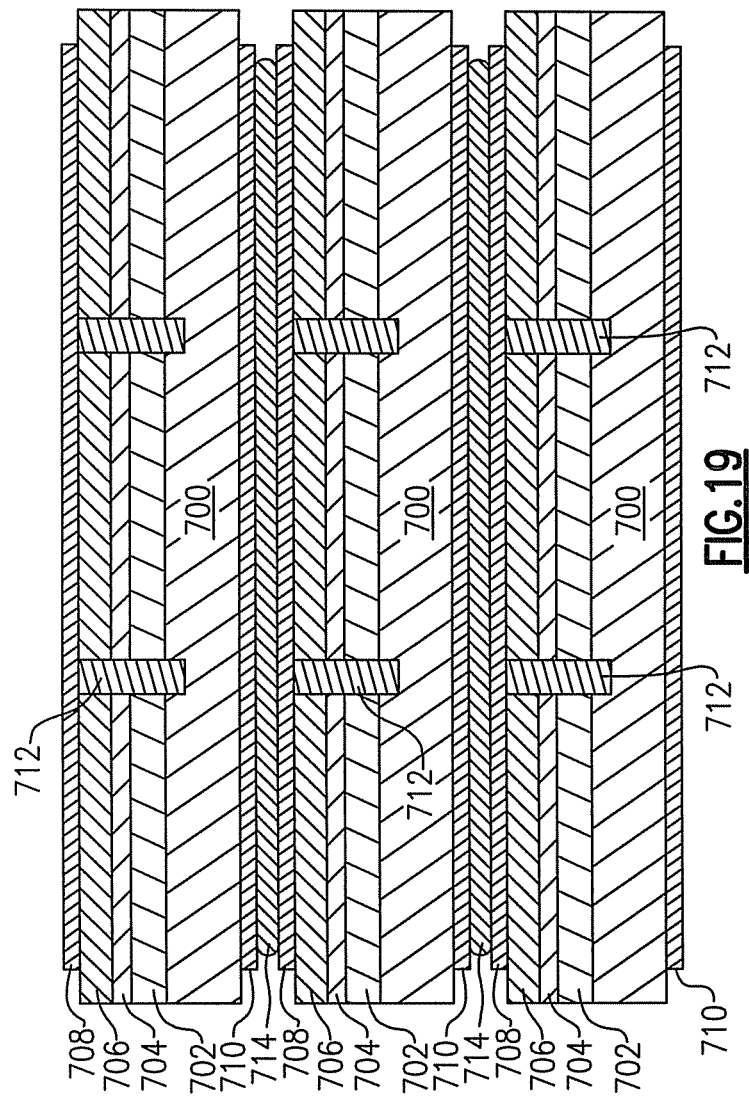
FIG. 19 is a cross-sectional schematic illustrating the interconnection of multiple substrates having vertical light emitting diode devices formed thereon by stacking the substrates on each other.
Figure 20:
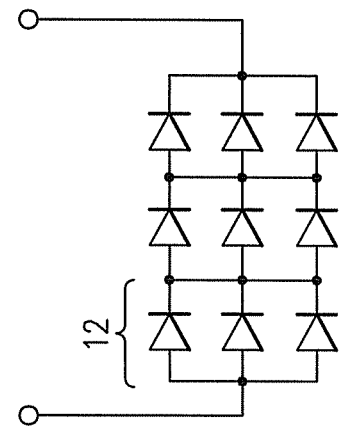
FIG. 20 is a circuit diagram of the interconnected substrates of FIG. 19.

FIG. 19 illustrates embodiments of the present inventive subject matter that provide a stack of light emitting diode devices. In FIG. 19, vertical light emitting diode devices that are mechanically connected on a common substrate 700 are stacked and electrically interconnected such that light emitting diode devices on a common substrate 700 are electrically connected in parallel and then multiple substrates 700 are interconnected to provide a string of light emitting diode devices. The n-contact 710 and the p-contact 708 each extend across multiple devices to connect the devices in parallel. Conductive regions 714 (e.g., solder regions, such as silver epoxy) are provided to provide electrical connection, and in some embodiments also mechanical bonding. Thus, the circuit illustrated in FIG. 20 is provided by the substrate stack illustrated in FIG. 19.

Figure 21:
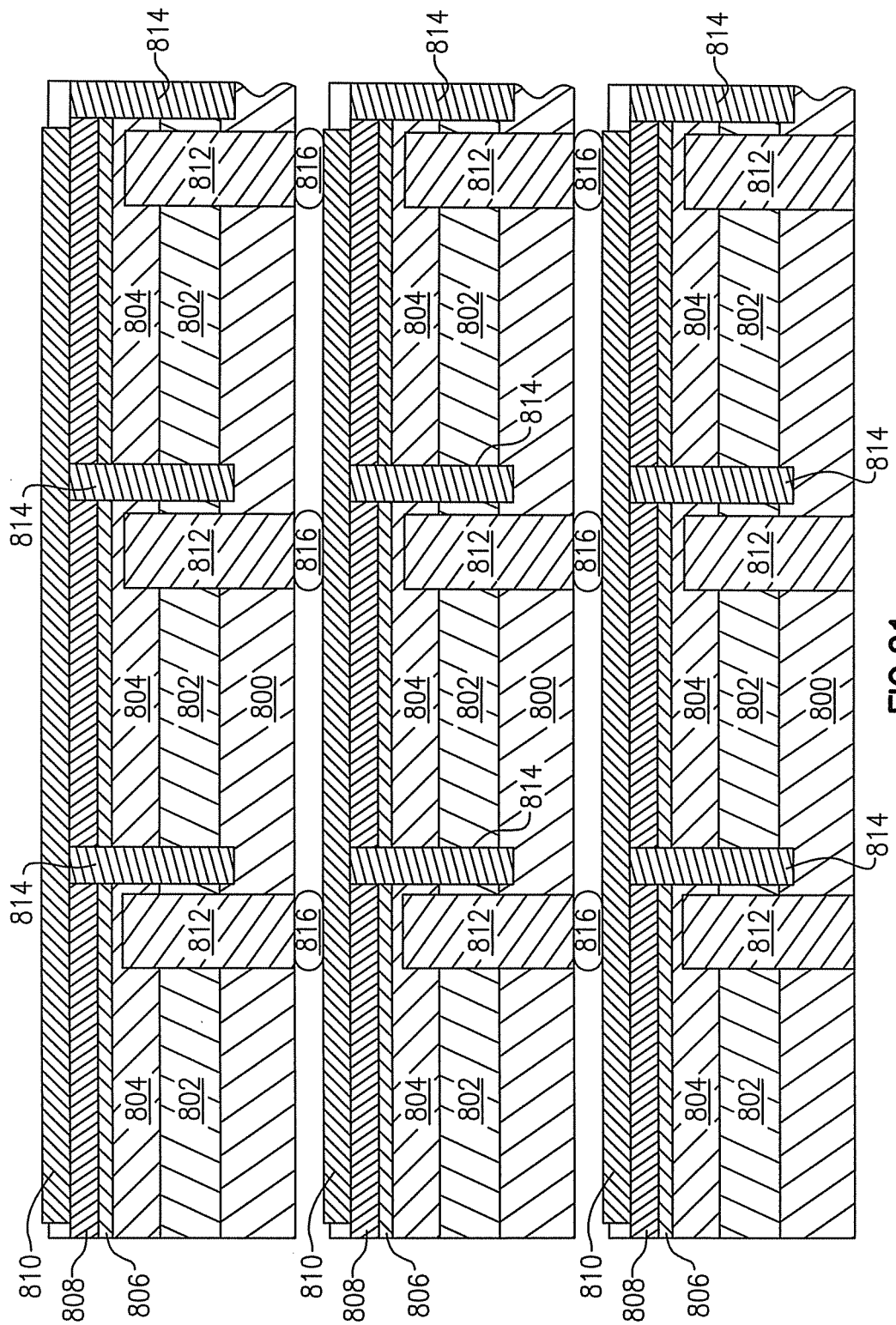
FIG. 21 is a cross-sectional schematic illustrating the interconnection of multiple substrates having lateral light emitting diode devices formed thereon by stacking the substrates on each other.

While FIG. 19 illustrates vertical devices (e.g., an n contact 710 on an n-type conducting substrate 700 (which, by virtue of its n-type conductivity and its placement in the device, can also be referred to as an n-type layer), a conducting buffer layer 702, quantum wells 704, a p-type layer 706, a p-contact 708 and isolation regions 712) that are electrically connected in parallel at the substrate level, lateral devices or combinations of vertical and lateral devices could also be provided. For example, lateral devices with through vias to provide backside contacts could be utilized as well. Also, the vias need not be through vias, as illustrated in FIG. 21 where the n-contacts 812 of the lateral devices are made from the back side of the substrate 800. The devices of FIG. 21 may include an n contact 812, an insulating or semi-insulating substrate 800, a buffer layer 802, an n-type layer 804, quantum wells 806, a p-type layer 808, a p-contact 810 and isolation regions 814 as described above, for example, with reference to FIGS. 2 and 3. The n contacts 812 and the p contacts 810 may be connected using solder bumps 816 or other bonding techniques. Also illustrated in FIG. 21, a common p contact 810 is provided for multiple devices to connect the devices in parallel.

In addition to the interconnection illustrated in FIGS. 19 and 21, the interconnect layer described above with reference to FIG. 18 could also be utilized to connect, mechanically and electrically, stacks of substrates having a plurality of individual light emitting diode devices.

Figure 23:
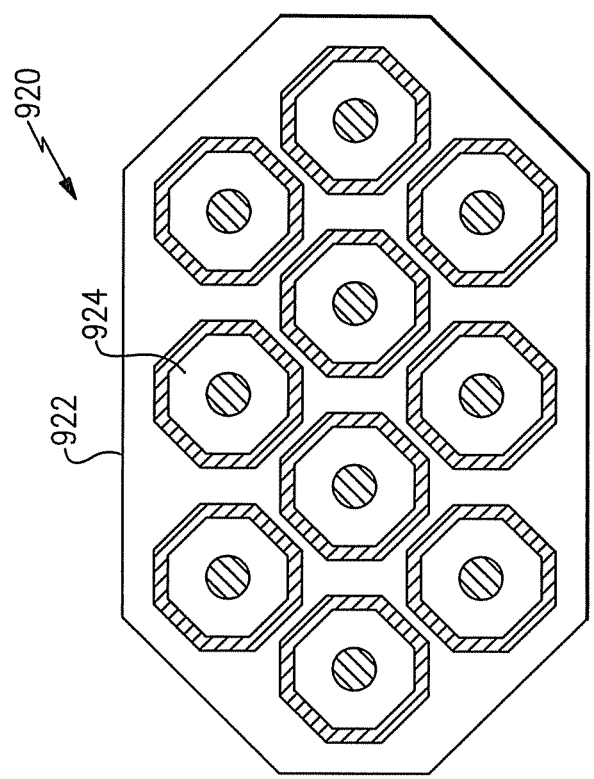
FIG. 23 is a top plan view of a common substrate having non-rectangular light emitting diode devices formed thereon.
Figure 22:
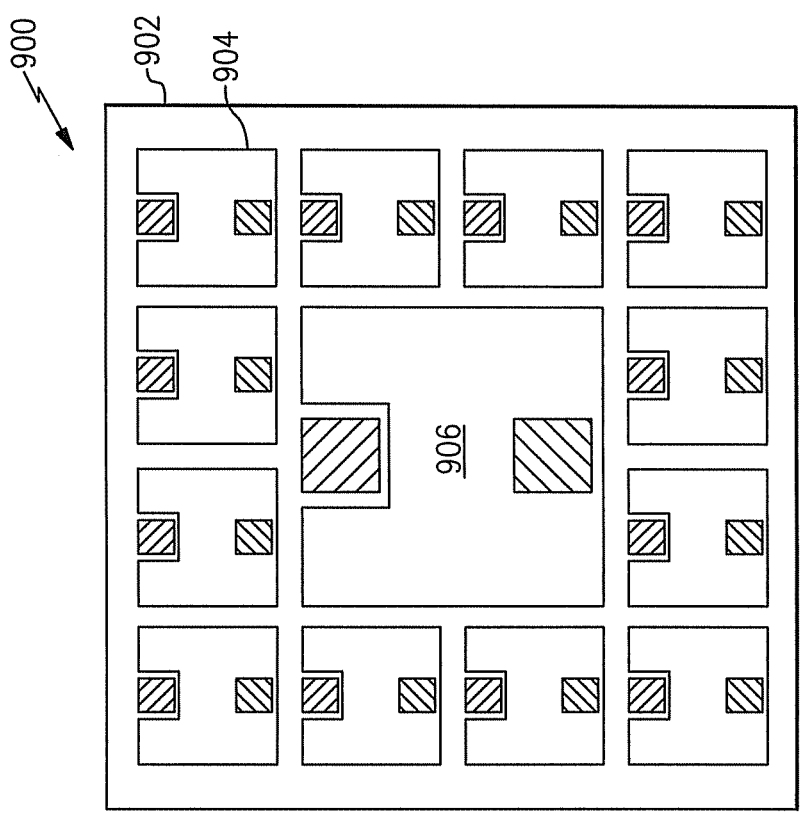
FIG. 22 is a top plan view of a common substrate having light emitting diode devices of differing sizes formed thereon.
Figure 24:
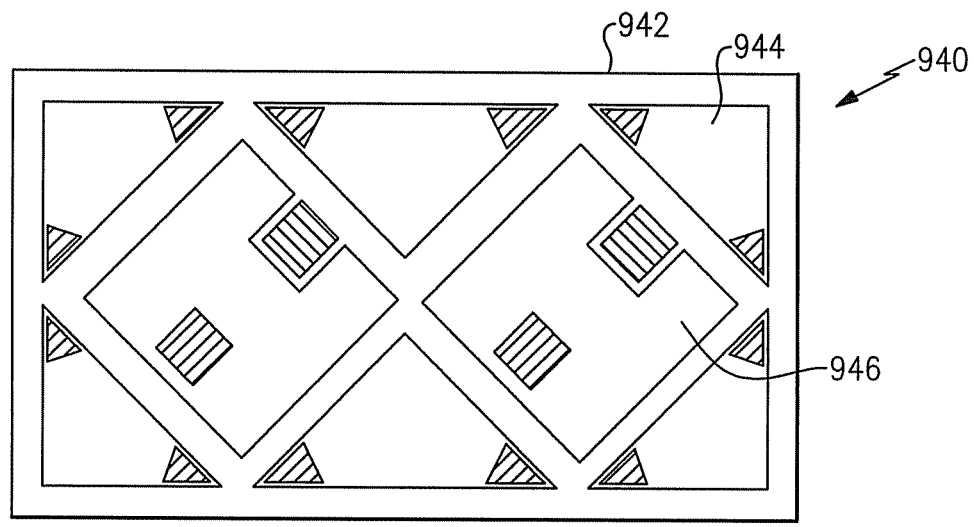
FIG. 24 is a top plan view of a common substrate having light emitting diode devices of differing sizes and shapes formed thereon.

FIGS. 22 through 24 illustrate that the light emitting diode devices on the substrates need not all have the same shape and/or size and need not be rectangular or square. For example, FIG. 22 illustrates a light emitter 900 with one large light emitting diode device 906 surrounded by a plurality of smaller light emitting diode devices 904 on a common substrate 902 FIG. 23 illustrates a light emitter 920 with hexagonal light emitting diode devices 924 on a common substrate 922. FIG. 24 illustrates a light emitter 940 with a combination of square light emitting diode devices 946 and triangular light emitting diode devices 944 on a common substrate 942. Different configurations of the light emitting diode devices may be provided for any of a number of reasons. For example, different configurations may be provided to maximize the number of light emitting diode devices in a given area, to simplify interconnection or to improve thermal uniformity or heat extraction. For example, if it is more difficult to extract heat from light emitting diode devices in a particular portion of a substrate, light emitting diode devices in this portion could be made a different size to increase Vf and reduce current through the light emitting diode devices.

In each of the dies depicted in FIGS. 22-24, the die comprises a monolithic n-type layer comprising a plurality of n-type regions and a monolithic p-type layer comprising a plurality of p-type regions, wherein the n-type regions are isolated from each other by the isolation region, the p-type regions are isolated from each other by the isolation region, the n-type regions are positioned relative to each other in a manner which would prevent dicing the n-type layer into individual n-type regions with a conventional wafer cutting device (i.e., a conventional wafer cutting device would need to cut through the larger device in order to singulate all of the smaller devices), i.e., the n-type region (and the p-type region) of the large device extends across a line defined by the isolation region extending through the respective pairs of other n-type regions above the large device, below the large device, to the right of the large device and to the left of the large device.

Figure 25:
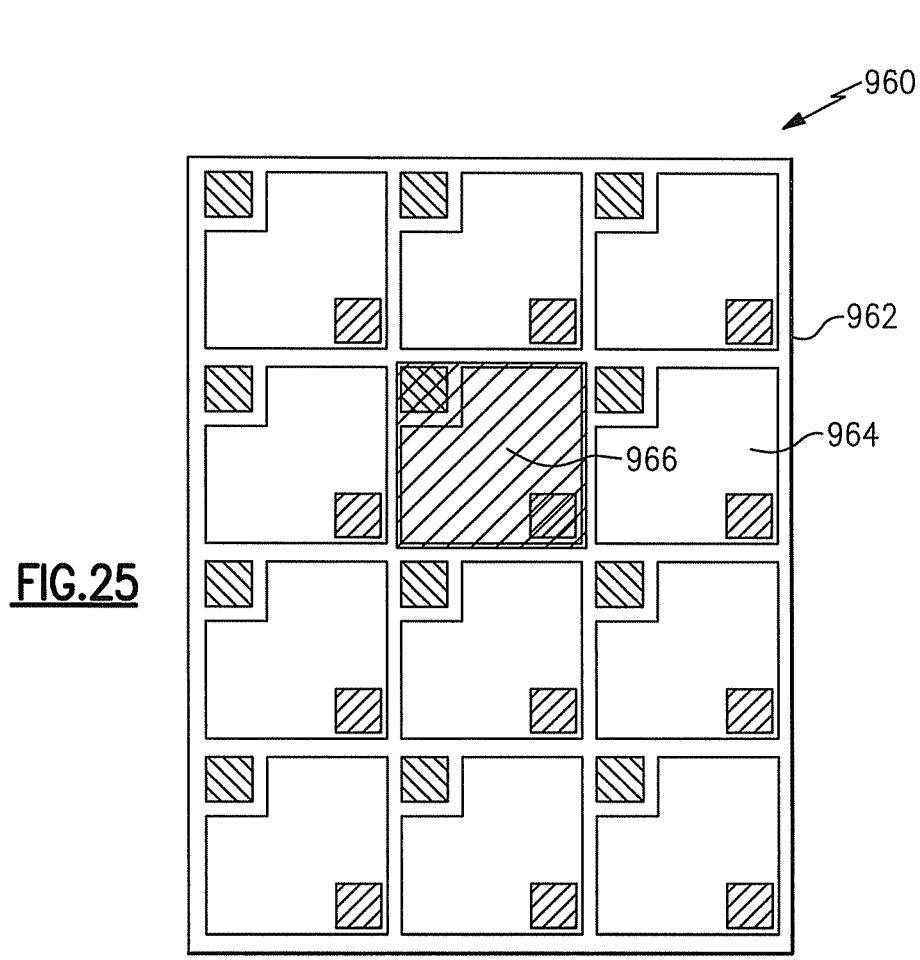
FIG. 25 is a top plan view of a common substrate having light emitting diode devices that can be selectively interconnected to avoid connected shorting light emitting diode devices together.

FIG. 25 illustrates the ability to selectively electrically interconnect light emitting diode devices using any one of the submounts as described above. By coating or otherwise covering contact regions of an light emitting diode device with an insulator or material that prevents electrical connection and/or bonding to the submount, short circuited light emitting diode devices may be identified at the time of manufacture and eliminated from the array. Thus, FIG. 25 illustrates a light emitter 960 with a plurality of light emitting diode devices 964 on a common substrate 962. One of the light emitting diode devices 966 has been prevented from making contact with the submount so as to isolate the light emitting diode device 966. An inkjet or other selective application process or an insulating material may be used to selective isolate light emitting diode devices from the array. Alternatively, after identifying a shorted light emitting diode device, one or more of the contacts of the light emitting diode device could be removed to prevent electrical connection. Thus, shorting across a row of light emitting diode devices in the array may be avoided and the overall voltage across the array may be maintained.

FIG. 25 illustrates that the middle light emitting diode device 966 in the second row has been identified as shorted and isolated such that the light emitting diode device 966 will not be connected in the array when the monolithic large area substrate 962 is mounted to the interconnection submount. Such isolation of a defective device may provide means for healing defects in an array of devices on a common substrate. Operations for the identification and isolation of light emitting diode devices within an array are illustrated in FIG. 26.

Figure 26:
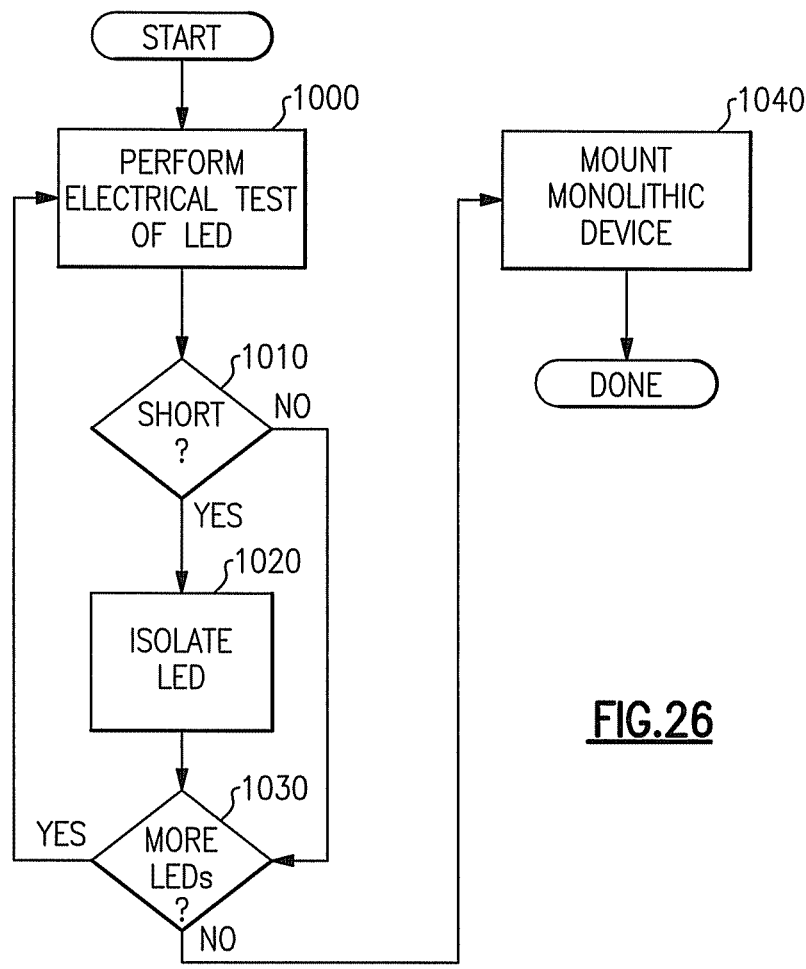
FIG. 26 is a flowchart illustrating operations for selectively electrically connecting light emitting diode devices that are mechanically connected on a common substrate.

In FIG. 26, operations begin by electrically testing a light emitting diode device on the common substrate (block 1000). Such a test may, for example, be carried out with an automated probe that individually activates each light emitting diode device. The electrical test may measure any number of electrical or photonic characteristics of the device but, for purposes of interconnection, may determine if the individual light emitting diode device is shorted. Such a test is preferably performed after all processing steps are performed that could potentially cause such a short. If the light emitting diode device is shorted (block 1010), then the light emitting diode device is isolated (block 1020) so as to not make a connection to other light emitting diode devices in the array. Such an isolation may be performed as discussed above, for example, by inkjet printing of an insulating material, by etching to remove one or more contact using, for example, a stepper mask or other suitable technique known to those of skill in the art. If more light emitting diode devices are to be evaluated (block 1030) the process can be repeated from block 1000. When all light emitting diode devices have been evaluated (block 1030), the monolithic structure may be mounted to the submount to electrically interconnect the individual light emitting diode devices (block 1040).

The operations illustrated in FIG. 26 may be performed before or after the monolithic collection of devices is separated from the wafer. In addition, the separation of portions of a wafer into individual monolithic light emitters which have a plurality of mechanically connected light emitting diode devices can be carried out based on the locations of defective parts so as to increase the yield of such monolithic light emitters.

Furthermore, while the operations illustrated in FIG. 26 are described with reference to a linear step-wise process, operations may be performed in parallel or out of turn as long as the overall operations achieve the desired result of selectively isolating defective light emitting diode devices. Thus, for example, all light emitting diode devices on a common substrate could be activated at once, and the electrical characteristics measured in parallel. Thus, embodiments of the present inventive subject matter should not be construed as limited to the particular sequence of operations illustrated in FIG. 26.

Figure 27:
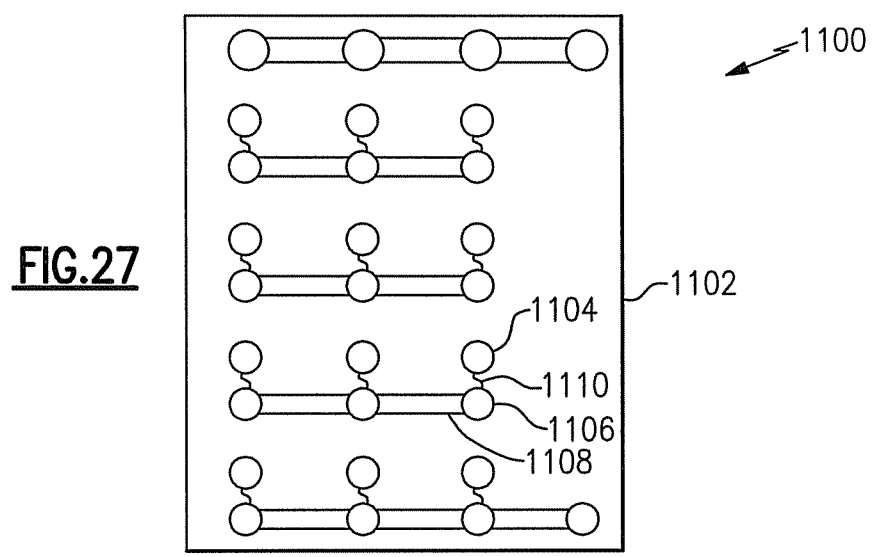
FIG. 27 is a top plan view of a submount incorporating fused connections.

FIG. 27 illustrates a further example of a submount according to some embodiments that provide means for healing a defect in a device. In the submount 1100 illustrated in FIG. 27, adjacent cathode contacts 1104 and anode contacts 1106 in a row are connected through a fused link 1106 in/on the submount substrate 1102. The fused link 1106 may be set such that if all of the current that flows through the array flows through the link, the fuse will open. Thus, if a light emitting diode device in a row short circuits, the fuse 1110 will open and the current will be redirected through the remaining light emitting diode devices in the row through the interconnection 1108. If all but one of the light emitting diode devices in the row short circuit, then the last light emitting diode device will carry the entire current, and the fuse 1110 will open for that light emitting diode device and the entire light emitter will be open circuited (at which point the light emitter will no longer function).

A lighting system is also provided that includes a boost power supply having an output voltage that is greater than a corresponding input voltage, and a light emitter. The light emitter includes a plurality of light emitting devices from a contiguous region of a wafer of light emitting devices, the plurality of light emitting devices being electrically connected as a plurality of serially connected subsets of at least three parallel connected light emitting devices electrically coupled to the output voltage of the boost power supply. The boost power supply may be configured to be coupled to an AC power source to provide the input voltage. Boost power supply configurations are known to those of skill in the art. Boost power supplies may be highly efficient. Furthermore, as discussed above, by providing a high voltage light emitter, $I^2R$ losses may be reduced because the current through the light emitter may be reduced in comparison to corresponding lower voltage light emitters. Combining the high voltage light emitter as described herein with a boost power supply may provide very high system efficacies. Thus, in some embodiments of the present inventive subject matter, the high voltage light emitters are provided to operate at a voltage of at least 50 volts, at least 150 volts, at least 325 volts or at least 395 volts. The operating voltage of the high voltage light emitter may be controlled by the forward voltage drop of the individual devices and the number of subsets of parallel-connected devices that are connected in series. Thus, for example, if a 90 volt device is desired, 30 subsets of devices, each with a $V_f$ of 3 volts, could be connected in series.

Representative examples of circuits which include a boost component are described in U.S. Patent Application No. 60/844,325, filed on Sep. 13, 2006, entitled "BOOST/FLYBACK POWER SUPPLY TOPOLOGY WITH LOW SIDE MOSFET CURRENT CONTROL", and U.S. patent application Ser. No. 11/854,744 (now U.S. Patent Application Publication No. 2008/0088248), filed Sep. 13, 2007, the entireties of which are hereby incorporated by reference.

While embodiments of the present inventive subject matter have been described with reference to a multi-quantum well structure, the present inventive subject matter may be utilized with any suitable light emitting diode device configuration(s). Furthermore, light extraction enhancements, such as internal reflecting layers, transparent ohmic contacts and the like may be utilized to improve light extraction from the individual light emitting diode devices. Accordingly, embodiments of the present inventive subject matter should not be construed as limited to a particular light emitting diode device configuration, but may be used with any configuration capable of being mounted to a submount for electrical interconnection to provide a high voltage monolithic light emitter.

The light emitters of the present inventive subject matter can be supplied with electricity in any desired manner. Skilled artisans are familiar with a wide variety of power supplying apparatuses, and any such apparatuses can be employed in connection with the present inventive subject matter. The light emitters of the present inventive subject matter can be electrically connected (or selectively connected) to any desired power source, persons of skill in the art being familiar with a variety of such power sources.

While inventive aspects have been described above primarily with reference to monolithic devices for operation with DC power sources, additional inventive aspects may provide monolithic devices suitable for operation with AC and/or DC power sources. Examples of such devices are illustrated in FIGS. 28 and 29.

Figure 28:
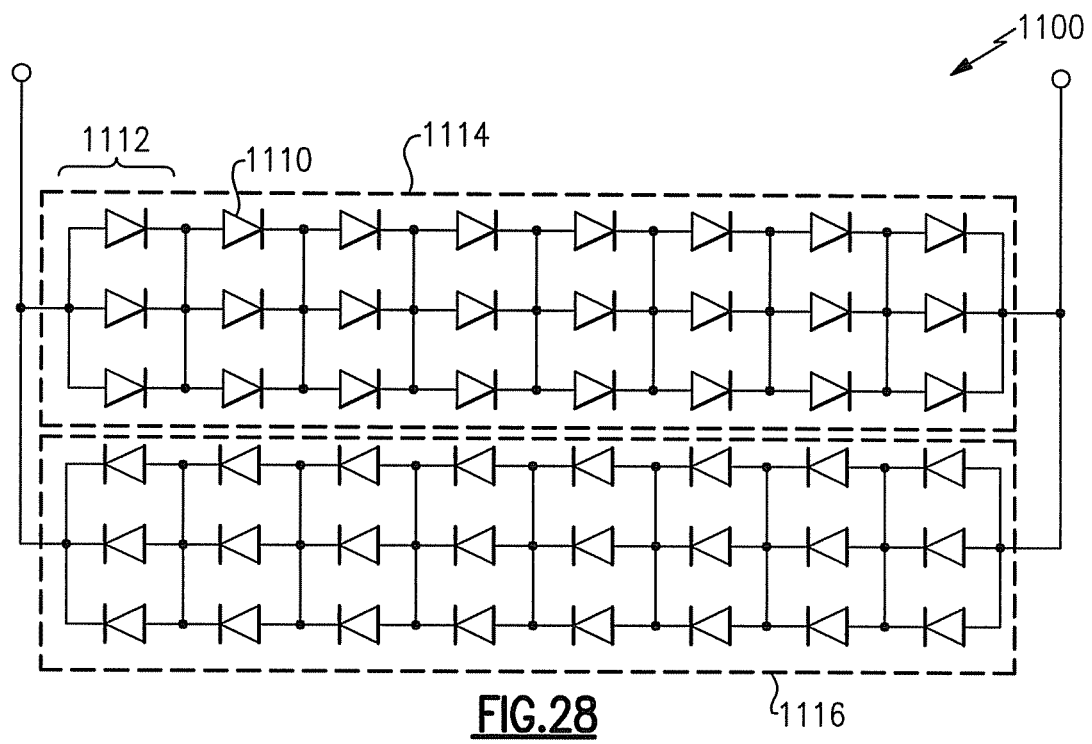
FIG. 28 is a schematic drawing of a lighting system according to some embodiments of the present inventive subject matter.

FIG. 28 illustrates an AC monolithic device 1100. The AC monolithic device 1100 includes a plurality of light emitting diodes 1110 provided as two or more arrays 1114, 1116 of serially connected subsets 1112 of parallel connected light emitting diodes 1110. The diodes 1110 may be interconnected as described elsewhere herein. The diodes 1110 may have a common substrate and/or be formed from a common n-type or p-type layer. The arrays 1114 and 1116 may be electrically arranged in an anti-parallel relationship such that when an alternating current (AC) power source is applied to the two arrays 1114, 1116, substantially all of the current flows through only one of the arrays on alternating cycles of the AC input. Thus, the monolithic device 1100 may be suitable for use as an AC device. The expression "anti-parallel", as used herein, refer's to circuitry in which arrays of diodes are arranged in parallel, with the diodes in at least one array being oriented (biased) in a direction which is opposite to the direction of orientation (bias) of the diodes in at least one other array (as shown in the circuit depicted in FIG. 28).

The monolithic device 1100 may be made using any of the fabrication techniques described herein that are capable of providing the interconnections illustrated in FIG. 28. The number of serially connected subsets 1112 of light emitting diodes 1110 may be selected based on the desired operating voltage. Also, the number of light emitting diodes 1110 that are connected in parallel may be selected as described above and should include at least three parallel connected devices.

Figure 29:
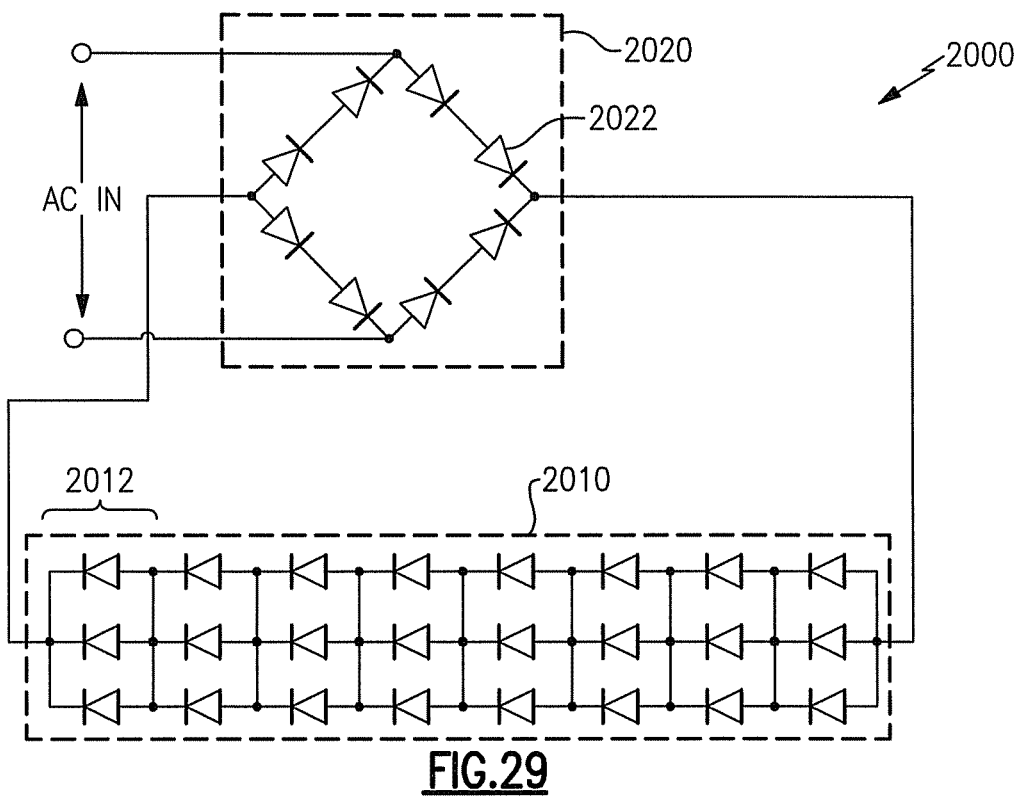
FIG. 29 is a schematic drawing of a lighting system according to some embodiments of the present inventive subject matter.

FIG. 29 illustrates a monolithic device 2000 that may receive an AC or DC input. In particular, the monolithic device 2000 includes a rectifying bridge 2020 and one or more arrays 2010 of serially connected subsets 2012 of parallel connected light emitting devices. The rectifying bridge 2020 may be constructed of light emitting devices 2022. The light emitting devices 2022 may be formed on a common substrate, from a common n-type or p-type layer or from a common material system, such as SiC, GaN, etc., as the light emitting devices in the array 2010. The diodes 2022 may also be non-light emitting. The number of diodes 2022 in each leg of the bridge 2020 depends on the reverse breakdown characteristics of the diodes and should be sufficient to support the reverse voltage from alternating cycles of the AC input. While the diodes 2022 are shown as two diodes serially connected, other numbers of diodes may be utilized. Furthermore, the diodes 2022 of the bridge 2020 may be provided as serially connected subsets of parallel connected diodes as described herein.

The output of the bridge 2020 is a full wave rectified voltage that is provided to the array 2010. As described above, the number of serially connected devices in the array 2010 may be selected based on the operating voltage provided by the bridge 2020.

The monolithic device 2000 may be provided using any suitable fabrication and interconnection technique as described above. Furthermore, while the monolithic device is illustrated in FIG. 29 with an AC input, a DC input could be applied to the device.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combinations of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

Any two or more structural parts of the light emitter's described herein can be integrated. Any structural part of the light emitters described herein can be provided in two or more parts (which are held together, if necessary). Similarly, any two or more functions can be conducted simultaneously, and/or any function can be conducted in a series of steps.

That which is claimed is:

1. A high voltage light emitter, comprising:
a plurality of light emitting devices on a substrate; and
an interconnection submount to which the plurality of light emitting devices are electrically connected;
wherein the light emitting devices are electrically interconnected by the interconnection submount to provide an array of at least two serially connected subsets of light emitting devices, each subset comprising at least three light emitting devices electrically connected in parallel within the subset,
the interconnection submount comprising at least a first interconnection pattern,
the first interconnection pattern electrically connected to respective cathodes of each of at least three light emitting devices in a first subset of light emitting devices and to respective anodes of each of at least three light emitting devices in a second subset of light emitting devices,
the first interconnection pattern extending sequentially:
from a cathode of a first light emitting device in the first subset to an anode of a first light emitting device in the second subset,
from the anode of the first light emitting device in the second subset to a cathode of a second light emitting device in the first subset,
from the cathode of the second light emitting device in the first subset to an anode of a second light emitting device in the second subset,
from the anode of the second light emitting device in the second subset to a cathode of a third light emitting device in the first subset,
and from the cathode of the third light emitting device in the first subset to an anode of a third light emitting device in the second subset.

2. The high voltage light emitter of claim 1, wherein fewer than all of the plurality of light emitting devices are electrically interconnected in the array of light emitting devices.

3. The high voltage light emitter of claim 1, wherein the interconnection submount further comprises:
a submount substrate; and
an insulator layer on the submount.

4. The high voltage light emitter of claim 3, wherein the interconnection submount further comprises a mirrored layer disposed between the submount substrate and the insulator layer.

5. The high voltage light emitter of claim 4, wherein all of the electrical interconnections of light emitting devices are provided by the pattern of electrically conductive elements.

6. The high voltage light emitter of claim 3, wherein a portion of the interconnections of light emitting devices is provided by the pattern of electrically conductive elements and a portion of the interconnections are provided by conductive elements on the substrate of the plurality of light emitting devices.

7. The high voltage light emitter of claim 1, wherein the light emitting devices comprise light emitting diode devices.

8. The high voltage light emitter of claim 7, wherein the light emitting diode devices are isolated from one another by at least one insulating region.

9. The high voltage light emitter of claim 7, wherein the light emitting diode devices are isolated from one another by at least one trench.

10. The high voltage light emitter of claim 7, wherein the light emitting diode devices comprise lateral devices and/or vertical devices and have both cathode and anode connections on a same side of the light emitting diode devices.

11. The high voltage light emitter of claim 1, wherein the plurality of light emitting devices have different sizes and/or shapes.

12. The high voltage light emitter of claim 1, wherein the plurality of light emitting devices are mechanically interconnected by a common substrate on which the light emitting devices were formed.

13. The high voltage light emitter of claim 1, wherein:
the first interconnection pattern extends diagonally from the cathode of the first light emitting device in the first subset to the anode of the first light emitting device in the second subset,
the first interconnection pattern extends diagonally from the anode of the first light emitting device in the second subset to the cathode of the second light emitting device in the first subset,
the first interconnection pattern extends diagonally from the cathode of the second light emitting device in the first subset to the anode of the second light emitting device in the second subset,
the first interconnection pattern extends diagonally from the anode of the second light emitting device in the second subset to the cathode of the third light emitting device in the first subset,
and the first interconnection pattern extends diagonally from the cathode of the third light emitting device in the first subset to the anode of the third light emitting device in the second subset.

14. The high voltage light emitter of claim 13, wherein:
the first light emitting diode in the first subset further comprises an anode of the first light emitting diode in the first subset,
the second light emitting diode in the first subset further comprises an anode of the second light emitting diode in the first subset,
the third light emitting diode in the first subset further comprises an anode of the third light emitting diode in the first subset,
the first light emitting diode in the second subset further comprises a cathode of the first light emitting diode in the second subset,
the second light emitting diode in the second subset further comprises a cathode of the second light emitting diode in the second subset,
the third light emitting diode in the second subset further comprises a cathode of the third light emitting diode in the second subset,
the anode of the first light emitting diode in the first subset and the cathode of the first light emitting diode in the first subset are on opposite corners of the first light emitting diode in the first subset,
the anode of the second light emitting diode in the first subset and the cathode of the second light emitting diode in the first subset are on opposite corners of the second light emitting diode in the first subset,
the anode of the third light emitting diode in the first subset and the cathode of the third light emitting diode in the first subset are on opposite corners of the third light emitting diode in the first subset,
the anode of the first light emitting diode in the second subset and the cathode of the first light emitting diode in the second subset are on opposite corners of the first light emitting diode in the second subset,
the anode of the second light emitting diode in the second subset and the cathode of the second light emitting diode in the second subset are on opposite corners of the second light emitting diode in the second subset, and
the anode of the third light emitting diode in the second subset and the cathode of the third light emitting diode in the second subset are on opposite corners of the third light emitting diode in the second subset.

15. A high voltage light emitter as recited in claim 1, wherein:
the interconnection submount further comprises an anode contact, and
the anode contact comprises a continuous electrically conductive contact electrically connected to respective anodes of each light emitting device in the first subset of light emitting devices.

16. A high voltage light emitter as recited in claim 1, wherein:
the first interconnection pattern comprises a continuous electrically conductive contact electrically connected to each of said respective cathodes of light emitting devices in the first subset of light emitting devices and to each of said respective anodes of light emitting devices in the second subset of light emitting devices.

17. A high voltage light emitter as recited in claim 1, wherein:
the interconnection submount further comprises a cathode contact, and
the cathode contact comprises a continuous electrically conductive contact electrically connected to respective cathodes of each light emitting device in a last-in-series subset of light emitting devices, the last-in-series subset comprising at least three light emitting devices.

18. A high voltage light emitter as recited in claim 1, wherein:
the interconnection submount further comprises an anode contact and a cathode contact,
the anode contact comprises a continuous electrically conductive contact electrically connected to respective anodes of each light emitting device in the first subset of light emitting devices,
the first interconnection pattern comprises a continuous electrically conductive contact electrically connected to each of said respective cathodes of light emitting devices in the first subset of light emitting devices and to each of said respective anodes of light emitting devices in the second subset of light emitting devices, and
the cathode contact comprises a continuous electrically conductive contact electrically connected to respective cathodes of each light emitting device in a last-in-series subset of light emitting devices, the last-in-series subset comprising at least three light emitting devices.

19. A high voltage light emitter as recited in claim 1, wherein:
the interconnection submount further comprises an anode contact and a cathode contact,
the anode contact comprises a continuous electrically conductive contact electrically connected to respective anodes of each light emitting device in the first subset of light emitting devices,
the cathode contact comprises a continuous electrically conductive contact electrically connected to respective cathodes of each light emitting device in a last-in-series subset of light emitting devices, the last-in-series subset comprising at least three light emitting devices,
the interconnection submount comprises a plurality of interconnection patterns comprising said first interconnection pattern, a second interconnection pattern and a third interconnection pattern,
the first interconnection pattern comprises a continuous electrically conductive contact electrically connected to each of said respective cathodes of light emitting devices in the first subset of light emitting devices and to each of said respective anodes of light emitting devices in the second subset of light emitting devices,
the second interconnection pattern comprises a continuous electrically conductive contact electrically connected to respective cathodes of each light emitting device in the second subset of light emitting devices and to respective anodes of light emitting devices in a third subset of light emitting devices,
the third interconnection pattern comprises a continuous electrically conductive contact electrically connected to each of respective cathodes of light emitting devices in the third subset of light emitting devices and to respective anodes of light emitting devices in a fourth subset of light emitting devices.

20. A high voltage light emitter, comprising:
a first plurality of light emitting devices on a first substrate; and
an interconnection submount to which the plurality of light emitting devices are electrically connected, the interconnection submount having electrical circuitry thereon; and
wherein the light emitting devices are electrically interconnected by the interconnection submount to provide a series of parallel-connected subsets of light emitting devices, in which for each parallel-connected subset of light emitting devices, the light emitting devices are electrically connected in parallel within the subset,
the interconnection submount comprising at least a first interconnection pattern,
the first interconnection pattern electrically connected to respective cathodes of each of at least three light emitting devices in a first subset of light emitting devices and to respective anodes of each of at least three light emitting devices in a second subset of light emitting devices,
the first interconnection pattern extending sequentially:
from a cathode of a first light emitting device in the first subset to an anode of a first light emitting device in the second subset,
from the anode of the first light emitting device in the second subset to a cathode of a second light emitting device in the first subset,
from the cathode of the second light emitting device in the first subset to an anode of a second light emitting device in the second subset,
from the anode of the second light emitting device in the second subset to a cathode of a third light emitting device in the first subset,
and from the cathode of the third light emitting device in the first subset to an anode of a third light emitting device in the second subset.

21. The high voltage light emitter of claim 20, wherein the array comprises at least two serially connected subsets of light emitting devices, each subset comprising at least three light emitting devices electrically connected in parallel within the subset.

22. The high voltage light emitter of claim 20, wherein the electrical circuitry comprises power supply circuitry configured to supply power to the light emitting devices.

23. The high voltage light emitter of claim 20, wherein the electrical circuitry comprises light emitting devices other than the plurality of light emitting devices on the substrate.

24. The high voltage light emitter of claim 20, wherein the electrical circuitry comprises:
light emitting devices other than the first plurality of light emitting devices on the first substrate; and
power supply circuitry configured to supply power to the light emitting devices.

25. The high voltage light emitter of claim 20, wherein the plurality of light emitting devices have different sizes and/or shapes.

26. The high voltage light emitter of claim 20, wherein the electrical circuitry comprises a plurality of fuses configured to selectively isolate failing ones of the plurality of light emitting devices.

27. The high voltage light emitter of claim 20, wherein the first plurality of light emitting devices are mechanically interconnected by a first common substrate on which the light emitting devices were formed.

28. The high voltage light emitter of claim 20, wherein:
the first interconnection pattern extends diagonally from the cathode of the first light emitting device in the first subset to the anode of the first light emitting device in the second subset,
the first interconnection pattern extends diagonally from the anode of the first light emitting device in the second subset to the cathode of the second light emitting device in the first subset,
the first interconnection pattern extends diagonally from the cathode of the second light emitting device in the first subset to the anode of the second light emitting device in the second subset, the first interconnection pattern extends diagonally from the anode of the second light emitting device in the second subset to the cathode of the third light emitting device in the first subset, and the first interconnection pattern extends diagonally from the cathode of the third light emitting device in the first subset to the anode of the third light emitting device in the second subset.

29. The high voltage light emitter of claim 28, wherein each light emitting device in the first subset of light emitting devices, the second subset of light emitting devices and the last-in-series subset of light emitting devices has an anode contact and a cathode contact on opposite corners of the light emitting device:

the first light emitting diode in the first subset further comprises an anode of the first light emitting diode in the first subset, the second light emitting diode in the first subset further comprises an anode of the second light emitting diode in the first subset, the third light emitting diode in the first subset further comprises an anode of the third light emitting diode in the first subset, the first light emitting diode in the second subset further comprises a cathode of the first light emitting diode in the second subset, the second light emitting diode in the second subset further comprises a cathode of the second light emitting diode in the second subset, the third light emitting diode in the second subset further comprises a cathode of the third light emitting diode in the second subset, the anode of the first light emitting diode in the first subset and the cathode of the first light emitting diode in the first subset are on opposite corners of the first light emitting diode in the first subset, the anode of the second light emitting diode in the first subset and the cathode of the second light emitting diode in the first subset are on opposite corners of the second light emitting diode in the first subset, the anode of the third light emitting diode in the first subset and the cathode of the third light emitting diode in the first subset are on opposite corners of the third light emitting diode in the first subset, the anode of the first light emitting diode in the second subset and the cathode of the first light emitting diode in the second subset are on opposite corners of the first light emitting diode in the second subset, the anode of the second light emitting diode in the second subset and the cathode of the second light emitting diode in the second subset are on opposite corners of the second light emitting diode in the second subset, and the anode of the third light emitting diode in the second subset and the cathode of the third light emitting diode in the second subset are on opposite corners of the third light emitting diode in the second subset.

30. A high voltage light emitter as recited in claim 20, wherein:

the interconnection submount further comprises an anode contact, and the anode contact comprises a continuous electrically conductive contact electrically connected to respective anodes of each light emitting device in the first subset of light emitting devices.

31. A high voltage light emitter as recited in claim 20, wherein:

the first interconnection pattern comprises a continuous electrically conductive contact electrically connected to each of said respective cathodes of light emitting devices in the first subset of light emitting devices and to each of said respective anodes of light emitting devices in the second subset of light emitting devices.

32. A high voltage light emitter as recited in claim 20, wherein:

the interconnection submount further comprises a cathode contact, and the cathode contact comprises a continuous electrically conductive contact electrically connected to respective cathodes of each light emitting device in a last-in-series subset of light emitting devices, the last-in-series subset comprising at least three light emitting devices.

33. A high voltage light emitter as recited in claim 20, wherein:

the interconnection submount further comprises an anode contact and a cathode contact, the anode contact comprises a continuous electrically conductive contact electrically connected to respective anodes of each light emitting device in the first subset of light emitting devices, the first interconnection pattern comprises a continuous electrically conductive contact electrically connected to each of said respective cathodes of light emitting devices in the first subset of light emitting devices and to each of said respective anodes of light emitting devices in the second subset of light emitting devices, and the cathode contact comprises a continuous electrically conductive contact electrically connected to respective cathodes of each light emitting device in a last-in-series subset of light emitting devices, the last-in-series subset comprising at least three light emitting devices.

34. A high voltage light emitter as recited in claim 20, wherein:

the interconnection submount further comprises an anode contact and a cathode contact, the anode contact comprises a continuous electrically conductive contact electrically connected to respective anodes of each light emitting device in the first subset of light emitting devices, the cathode contact comprises a continuous electrically conductive contact electrically connected to respective cathodes of each light emitting device in a last-in-series subset of light emitting devices, the last-in-series subset comprising at least three light emitting devices, the interconnection submount comprises a plurality of interconnection patterns comprising said first interconnection pattern, a second interconnection pattern and a third interconnection pattern, the first interconnection pattern comprises a continuous electrically conductive contact electrically connected to each of said respective cathodes of light emitting devices in the first subset of light emitting devices and to each of said respective anodes of light emitting devices in the second subset of light emitting devices, the second interconnection pattern comprises a continuous electrically conductive contact electrically connected to respective cathodes of each light emitting device in the second subset of light emitting devices and to respective anodes of light emitting devices in a third subset of light emitting devices, the third interconnection pattern comprises a continuous electrically conductive contact electrically connected to each of respective cathodes of light emitting devices in the third subset of light emitting devices and to respective anodes of light emitting devices in a fourth subset of light emitting devices.

35. A method of fabricating a high voltage light emitter, comprising:
providing a first plurality of light emitting devices on a first substrate;
providing an interconnection submount, the interconnection submount having electrical circuitry thereon; and
mounting the first substrate on the interconnection submount to electrically connect the light emitting devices to provide an array comprising a series of subsets of parallel-connected light emitting devices, in which for each subset of parallel-connected light emitting devices, the light emitting devices are electrically connected in parallel within the subset,
the interconnection submount comprising at least a first interconnection pattern,
the first interconnection pattern electrically connected to respective cathodes of each of at least three light emitting devices in a first subset of light emitting devices and to respective anodes of each of at least three light emitting devices in a second subset of light emitting devices,
the first interconnection pattern extending sequentially:
from a cathode of a first light emitting device in the first subset to an anode of a first light emitting device in the second subset,
from the anode of the first light emitting device in the second subset to a cathode of a second light emitting device in the first subset,
from the cathode of the second light emitting device in the first subset to an anode of a second light emitting device in the second subset,
from the anode of the second light emitting device in the second subset to a cathode of a third light emitting device in the first subset,
and from the cathode of the third light emitting device in the first subset to an anode of a third light emitting device in the second subset.

36. The method of claim 35, wherein the first plurality of light emitting devices are mechanically interconnected by a first common substrate on which the light emitting devices were formed.

37. The method of claim 35, wherein:
the first interconnection pattern extends diagonally from the cathode of the first light emitting device in the first subset to the anode of the first light emitting device in the second subset,
the first interconnection pattern extends diagonally from the anode of the first light emitting device in the second subset to the cathode of the second light emitting device in the first subset,
the first interconnection pattern extends diagonally from the cathode of the second light emitting device in the first subset to the anode of the second light emitting device in the second subset,
the first interconnection pattern extends diagonally from the anode of the second light emitting device in the second subset to the cathode of the third light emitting device in the first subset,
and the first interconnection pattern extends diagonally from the cathode of the third light emitting device in the first subset to the anode of the third light emitting device in the second subset.

38. The high voltage light emitter of claim 37, wherein:
the first light emitting diode in the first subset further comprises an anode of the first light emitting diode in the first subset,
the second light emitting diode in the first subset further comprises an anode of the second light emitting diode in the first subset,
the third light emitting diode in the first subset further comprises an anode of the third light emitting diode in the first subset,
the first light emitting diode in the second subset further comprises a cathode of the first light emitting diode in the second subset,
the second light emitting diode in the second subset further comprises a cathode of the second light emitting diode in the second subset,
the third light emitting diode in the second subset further comprises a cathode of the third light emitting diode in the second subset,
the anode of the first light emitting diode in the first subset and the cathode of the first light emitting diode in the first subset are on opposite corners of the first light emitting diode in the first subset,
the anode of the second light emitting diode in the first subset and the cathode of the second light emitting diode in the first subset are on opposite corners of the second light emitting diode in the first subset,
the anode of the third light emitting diode in the first subset and the cathode of the third light emitting diode in the first subset are on opposite corners of the third light emitting diode in the first subset,
the anode of the first light emitting diode in the second subset and the cathode of the first light emitting diode in the second subset are on opposite corners of the first light emitting diode in the second subset,
the anode of the second light emitting diode in the second subset and the cathode of the second light emitting diode in the second subset are on opposite corners of the second light emitting diode in the second subset, and
the anode of the third light emitting diode in the second subset and the cathode of the third light emitting diode in the second subset are on opposite corners of the third light emitting diode in the second subset.

39. A method as recited in claim 35, wherein:
the interconnection submount further comprises an anode contact, and
the anode contact comprises a continuous electrically conductive contact electrically connected to respective anodes of each light emitting device in the first subset of light emitting devices.

40. A method as recited in claim 35, wherein:
the first interconnection pattern comprises a continuous electrically conductive contact electrically connected to each of said respective cathodes of light emitting devices in the first subset of light emitting devices and to each of said respective anodes of light emitting devices in the second subset of light emitting devices.

41. A method as recited in claim 35, wherein:
the interconnection submount further comprises a cathode contact, and
the cathode contact comprises a continuous electrically conductive contact electrically connected to respective cathodes of each light emitting device in a last-in-series subset of light emitting devices, the last-in-series subset comprising at least three light emitting devices.

42. A method as recited in claim 35, wherein:

the interconnection submount further comprises an anode contact and a cathode contact, the anode contact comprises a continuous electrically conductive contact electrically connected to respective anodes of each light emitting device in the first subset of light emitting devices, the first interconnection pattern comprises a continuous electrically conductive contact electrically connected to each of said respective cathodes of light emitting devices in the first subset of light emitting devices and to each of said respective anodes of light emitting devices in the second subset of light emitting devices, and the cathode contact comprises a continuous electrically conductive contact electrically connected to respective cathodes of each light emitting device in a last-in-series subset of light emitting devices, the last-in-series subset comprising at least three light emitting devices.

43. A method as recited in claim 35, wherein:

the interconnection submount further comprises an anode contact and a cathode contact, the anode contact comprises a continuous electrically conductive contact electrically connected to respective anodes of each light emitting device in the first subset of light emitting devices, the cathode contact comprises a continuous electrically conductive contact electrically connected to respective cathodes of each light emitting device in a last-in-series subset of light emitting devices, the last-in-series subset comprising at least three light emitting devices, the interconnection submount comprises a plurality of interconnection patterns comprising said first interconnection pattern, a second interconnection pattern and a third interconnection pattern, the first interconnection pattern comprises a continuous electrically conductive contact electrically connected to each of said respective cathodes of light emitting devices in the first subset of light emitting devices and to each of said respective anodes of light emitting devices in the second subset of light emitting devices, the second interconnection pattern comprises a continuous electrically conductive contact electrically connected to respective cathodes of each light emitting device in the second subset of light emitting devices and to respective anodes of light emitting devices in a third subset of light emitting devices, the third interconnection pattern comprises a continuous electrically conductive contact electrically connected to each of respective cathodes of light emitting devices in the third subset of light emitting devices and to respective anodes of light emitting devices in a fourth subset of light emitting devices.

44. A light emitter, comprising:

a first n-type layer;
a first p-type layer;
a first n-type contact;
a second n-type contact;
a third n-type contact;
a fourth n-type contact;
a fifth n-type contact;
a sixth n-type contact;
a first p-type contact;
a second p-type contact;
a third p-type contact;
a fourth p-type contact;
a fifth p-type contact;
a sixth p-type contact; and
at least a first interconnection element, the first n-type layer comprising a first n-type region, a second n-type region, a third n-type region, a fourth n-type region, a fifth n-type region, and a sixth n-type region, the first n-type region, the second n-type region, the third n-type region, the fourth n-type region, the fifth n-type region, and the sixth n-type region do not directly contact each other, the first p-type layer comprising a first p-type region, a second p-type region, a third p-type region, a fourth p-type region, a fifth p-type region, and a sixth p-type region, the first p-type region, the second p-type region, the third p-type region, the fourth p-type region, the fifth p-type region, and the sixth p-type region do not directly contact each other, the first n-type region and the first p-type region together comprising a first light emitting device, the second n-type region and the second p-type region together comprising a second light emitting device, the third n-type region and the third p-type region together comprising a third light emitting device, the fourth n-type region and the fourth p-type region together comprising a fourth light emitting device, the fifth n-type region and the fifth p-type region together comprising a fifth light emitting device, the sixth n-type region and the sixth p-type region together comprising a sixth light emitting device, the first n-type contact electrically connected to the first n-type region, the second n-type contact electrically connected to the second n-type region, the third n-type contact electrically connected to the third n-type region, the fourth n-type contact electrically connected to the fourth n-type region, the fifth n-type contact electrically connected to the fifth n-type region, the sixth n-type contact electrically connected to the sixth n-type region, the first p-type contact electrically connected to the first p-type region, the second p-type contact electrically connected to the second p-type region, the third p-type contact electrically connected to the third p-type region, the fourth p-type contact electrically connected to the fourth p-type region, the fifth p-type contact electrically connected to the fifth p-type region, the sixth p-type contact electrically connected to the sixth p-type region, the first interconnection element comprising a first interconnection element first p-type contact, a first interconnection element second p-type contact, a first interconnection element third p-type contact, a first interconnection element fourth p-type contact, a first interconnection element fifth p-type contact, a first interconnection element sixth p-type contact, a first interconnection element first n-type contact, a first interconnection element second n-type contact, a first interconnection element third n-type contact, a first interconnection element fourth n-type contact, a first interconnection element fifth n-type contact, and a first interconnection element sixth n-type contact, the first interconnection element first p-type contact electrically connected to the first p-type contact,
the first interconnection element second p-type contact electrically connected to the second p-type contact,
the first interconnection element third p-type contact electrically connected to and the third p-type contact,
the first interconnection element fourth p-type contact electrically connected to the fourth p-type contact,
the first interconnection element fifth p-type contact electrically connected to the fifth p-type contact,
the first interconnection element sixth p-type contact electrically connected to the sixth p-type contact,
the first interconnection element first n-type contact electrically connected to the first n-type, contact,
the first interconnection element second n-type contact electrically connected to the second n-type, contact,
the first interconnection element third n-type contact electrically connected to the third n-type, contact,
the first interconnection element fourth n-type contact electrically connected to the fourth n-type, contact,
the first interconnection element fifth n-type contact electrically connected to the fifth n-type, contact,
the first interconnection element sixth n-type contact electrically connected to the sixth n-type, contact,
the first light emitting device electrically in parallel with the second light emitting device,
the first light emitting device electrically in parallel with the third light emitting device,
the second light emitting device electrically in parallel with the third light emitting device,
the fourth light emitting device electrically in parallel with the fifth light emitting device,
the fourth light emitting device electrically in parallel with the sixth light emitting device, and
the fifth light emitting device electrically in parallel with the sixth light emitting device,
a contact surface of the first n-type contact, a contact surface of the second n-type contact, a contact surface of the third n-type region contact, a contact surface of the fourth n-type contact, a contact surface of the fifth n-type contact, and a contact surface of the sixth n-type contact are all substantially coplanar with a first plane,
a contact surface of the first p-type contact, a contact surface of the second p-type contact, a contact surface of the third p-type contact, a contact surface of the fourth p-type contact, a contact surface of the fifth p-type contact, and a contact surface of the sixth p-type contact are all substantially coplanar with a second plane,
a contact surface of the first interconnection element first n-type contact, a contact surface of the first interconnection element second n-type contact, and a contact surface of the first interconnection element third n-type contact are all substantially coplanar with a third plane,
a contact surface of the first interconnection element first p-type contact, a contact surface of the first interconnection element second p-type contact and a contact surface of the first interconnection element third p-type contact are all substantially coplanar with a fourth plane,
the first plane is substantially parallel to the second plane, and
the first plane is spaced from the second plane.

45. The light emitter of claim 44, wherein said light emitter is suitable for operation with an AC power source.

46. The light emitter of claim 45, wherein said light emitter further comprises:

a second n-type layer;
a second p-type layer; and
a second interconnection element,
the second n-type layer comprising a seventh n-type region, an eighth n-type region, a ninth n-type region, a tenth n-type region, a eleventh n-type region, and a twelfth n-type region,
the seventh n-type region, the eighth n-type region, the ninth n-type region, the tenth n-type region, the eleventh n-type region, and the twelfth n-type region isolated from each other,
the second p-type layer comprising a seventh p-type region, an eighth p-type region, a ninth p-type region, a tenth p-type region, a eleventh p-type region, and a twelfth p-type region,
the seventh p-type region, the eighth p-type region, the ninth p-type region, the tenth p-type region, the eleventh p-type region, and the twelfth p-type region isolated from each other,
the seventh n-type region and the seventh p-type region together comprising a seventh light emitting device,
the eighth n-type region and the eighth p-type region together comprising a eighth light emitting device,
the ninth n-type region and the ninth p-type region together comprising a ninth light emitting device,
the tenth n-type region and the tenth p-type region together comprising a tenth light emitting device,
the eleventh n-type region and the eleventh p-type region together comprising a eleventh light emitting device,
the twelfth n-type region and the twelfth p-type region together comprising a twelfth light emitting device,
the second interconnection element comprising at least a second interconnection element seventh n-type contact, a second interconnection element eighth n-type contact, a second interconnection element ninth n-type contact, a second interconnection element seventh p-type contact, a second interconnection element eighth p-type contact, and a second interconnection element ninth p-type contact,
the second interconnection element seventh n-type contact electrically connected to the seventh n-type region,
the second interconnection element eighth n-type contact electrically connected to the eighth n-type region,
the second interconnection element ninth n-type contact electrically connected to the ninth n-type region,
the second interconnection element seventh p-type contact electrically connected to the tenth p-type region,
the second interconnection element eighth p-type contact electrically connected to the eleventh p-type region,
the second interconnection element ninth p-type contact electrically connected to the twelfth p-type region,
the second interconnection element seventh n-type contact electrically connected to the second interconnection element eighth n-type contact, the second interconnection element ninth n-type contact, the second interconnection element seventh p-type contact, the second interconnection element eighth p-type contact, and the second interconnection element ninth p-type contact.

47. The light emitter of claim 45, wherein said light emitter further comprises a rectifying bridge.

48. The light emitter of claim 44, wherein the light emitter further comprises at least one fuse link electrically connected in series with at least one of the light emitting devices.

49. The light emitter of claim 44, wherein the light emitter further comprises at least one means for opening an electrically conductive connection in series with at least one of the light emitting devices.

50. The light emitter of claim 44, wherein the light emitter further comprises a substrate layer, the first n-type layer and the first p-type layer between the substrate layer and the first interconnection element.

51. The light emitter of claim 50, wherein the light emitter further comprises at least one fuse link electrically connected in series with at least one of the light emitting devices and/or at least one means for opening an electrically conductive connection in series with at least one of the light emitting devices.

52. The light emitter of claim 44, wherein the light emitter further comprises a substrate layer, the substrate layer between the first p-type layer and the first interconnection element.

53. The light emitter of claim 52, wherein the light emitter further comprises at least one fuse link electrically connected in series with at least one of the light emitting devices.

54. The light emitter of claim 52, wherein the light emitter further comprises at least one means for opening an electrically conductive connection in series with at least one of the light emitting devices.

55. The light emitter of claim 44, wherein:
the first n-type layer is a monolithic n-type layer; and
the first p-type layer is a monolithic p-type layer.

56. A method of fabricating a high voltage light emitter, comprising:
providing a plurality of light emitting devices on a substrate; and
mounting the substrate on an interconnection submount to electrically connect the plurality of light emitting devices,
wherein the light emitting devices are electrically interconnected by the interconnection submount to provide an array of at least two serially connected subsets of light emitting devices, each subset comprising at least three light emitting devices electrically connected in parallel within the subset,
the interconnection submount comprising at least a first interconnection pattern,
the first interconnection pattern electrically connected to respective cathodes of each of at least three light emitting devices in a first subset of light emitting devices and to respective anodes of each of at least three light emitting devices in a second subset of light emitting devices,
the first interconnection pattern extending sequentially:
from a cathode of a first light emitting device in the first subset to an anode of a first light emitting device in the second subset,
from the anode of the first light emitting device in the second subset to a cathode of a second light emitting device in the first subset,
from the cathode of the second light emitting device in the first subset to an anode of a second light emitting device in the second subset,
from the anode of the second light emitting device in the second subset to a cathode of a third light emitting device in the first subset,
and from the cathode of the third light emitting device in the first subset to an anode of a third light emitting device in the second subset.

57. The method of claim 56, wherein the plurality of light emitting devices are mechanically interconnected by a common substrate on which the light emitting devices were formed.

58. The method of claim 56, wherein:
the first interconnection pattern extends diagonally from the cathode of the first light emitting device in the first subset to the anode of the first light emitting device in the second subset,
the first interconnection pattern extends diagonally from the anode of the first light emitting device in the second subset to the cathode of the second light emitting device in the first subset,
the first interconnection pattern extends diagonally from the cathode of the second light emitting device in the first subset to the anode of the second light emitting device in the second subset,
the first interconnection pattern extends diagonally from the anode of the second light emitting device in the second subset to the cathode of the third light emitting device in the first subset,
and the first interconnection pattern extends diagonally from the cathode of the third light emitting device in the first subset to the anode of the third light emitting device in the second subset.

59. The high voltage light emitter of claim 58, wherein:
the first light emitting diode in the first subset further comprises an anode of the first light emitting diode in the first subset,
the second light emitting diode in the first subset further comprises an anode of the second light emitting diode in the first subset,
the third light emitting diode in the first subset further comprises an anode of the third light emitting diode in the first subset,
the first light emitting diode in the second subset further comprises a cathode of the first light emitting diode in the second subset,
the second light emitting diode in the second subset further comprises a cathode of the second light emitting diode in the second subset,
the third light emitting diode in the second subset further comprises a cathode of the third light emitting diode in the second subset,
the anode of the first light emitting diode in the first subset and the cathode of the first light emitting diode in the first subset are on opposite corners of the first light emitting diode in the first subset,
the anode of the second light emitting diode in the first subset and the cathode of the second light emitting diode in the first subset are on opposite corners of the second light emitting diode in the first subset,
the anode of the third light emitting diode in the first subset and the cathode of the third light emitting diode in the first subset are on opposite corners of the third light emitting diode in the first subset,
the anode of the first light emitting diode in the second subset and the cathode of the first light emitting diode in the second subset are on opposite corners of the first light emitting diode in the second subset,
the anode of the second light emitting diode in the second subset and the cathode of the second light emitting diode in the second subset are on opposite corners of the second light emitting diode in the second subset, and
the anode of the third light emitting diode in the second subset and the cathode of the third light emitting diode in the second subset are on opposite corners of the third light emitting diode in the second subset.

60. A method as recited in claim 56, wherein:
the interconnection submount further comprises an anode contact, and
the anode contact comprises a continuous electrically conductive contact electrically connected to respective anodes of each light emitting device in the first subset of light emitting devices.

61. A method as recited in claim 56, wherein:
the first interconnection pattern comprises a continuous electrically conductive contact electrically connected to each of said respective cathodes of light emitting devices in the first subset of light emitting devices and to each of said respective anodes of light emitting devices in the second subset of light emitting devices.

62. A method as recited in claim 56, wherein:
the interconnection submount further comprises a cathode contact, and
the cathode contact comprises a continuous electrically conductive contact electrically connected to respective cathodes of each light emitting device in a last-in-series subset of light emitting devices, the last-in-series subset comprising at least three light emitting devices.

63. A method as recited in claim 56, wherein:
the interconnection submount further comprises an anode contact and a cathode contact,
the anode contact comprises a continuous electrically conductive contact electrically connected to respective anodes of each light emitting device in the first subset of light emitting devices,
the first interconnection pattern comprises a continuous electrically conductive contact electrically connected to each of said respective cathodes of light emitting devices in the first subset of light emitting devices and to each of said respective anodes of light emitting devices in the second subset of light emitting devices, and
the cathode contact comprises a continuous electrically conductive contact electrically connected to respective cathodes of each light emitting device in a last-in-series subset of light emitting devices, the last-in-series subset comprising at least three light emitting devices.

64. A method as recited in claim 56, wherein:
the interconnection submount further comprises an anode contact and a cathode contact,
the anode contact comprises a continuous electrically conductive contact electrically connected to respective anodes of each light emitting device in the first subset of light emitting devices,
the cathode contact comprises a continuous electrically conductive contact electrically connected to respective cathodes of each light emitting device in a last-in-series subset of light emitting devices, the last-in-series subset comprising at least three light emitting devices,
the interconnection submount comprises a plurality of interconnection patterns comprising said first interconnection pattern, a second interconnection pattern and a third interconnection pattern,
the first interconnection pattern comprises a continuous electrically conductive contact electrically connected to each of said respective cathodes of light emitting devices in the first subset of light emitting devices and to each of said respective anodes of light emitting devices in the second subset of light emitting devices,
the second interconnection pattern comprises a continuous electrically conductive contact electrically connected to respective cathodes of each light emitting device in the second subset of light emitting devices and to respective anodes of light emitting devices in a third subset of light emitting devices,
the third interconnection pattern comprises a continuous electrically conductive contact electrically connected to each of respective cathodes of light emitting devices in the third subset of light emitting devices and to respective anodes of light emitting devices in a fourth subset of light emitting devices.

* * * * *

UNITED STATES PATENT AND TRADEMARK OFFICE
CERTIFICATE OF CORRECTION

PATENT NO. : 10,586,787 B2
APPLICATION NO. : 12/017600
DATED : March 10, 2020
INVENTOR(S) : Gerald H. Negley et al.

Page 1 of 1

It is certified that error appears in the above-identified patent and that said Letters Patent is hereby corrected as shown below:

In the Claims

In Claim 44, Column 45:
Line 6, replace "electrically connected to and the third p-type contact," with --electrically connected to the third p-type contact,--.
Line 14, replace "connected to the first n-type, contact," with --connected to the first n-type contact,--.
Line 16, replace "electrically connected to the second n-type, contact," with --electrically connected to the second n-type contact,--.
Line 18, replace "electrically connected to the third n-type, contact," with --electrically connected to the third n-type contact,--.
Line 20, replace "electrically connected to the fourth n-type, contact," with --electrically connected to the fourth n-type contact,--.
Line 22, replace "connected to the fifth n-type, contact," with --connected to the fifth n-type contact--.
Line 24, replace "electrically connected to the sixth n-type, contact," with --electrically connected to the sixth n-type contact,--.
Line 39, replace "the third n-type region contact" with --the third n-type contact--.

Signed and Sealed this
Nineteenth Day of May, 2020

Andrei Iancu
*Director of the United States Patent and Trademark Office*